(12) United States Patent
Lee et al.

(10) Patent No.: US 11,099,677 B2
(45) Date of Patent: Aug. 24, 2021

(54) TOUCH DISPLAY DEVICE

(71) Applicant: LG Display Co., Ltd., Seoul (KR)

(72) Inventors: Yangsik Lee, Gyeonggi-do (KR);
HwiDeuk Lee, Gyeonggi-do (KR);
YongChan Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/064,349

(22) Filed: Oct. 6, 2020

(65) Prior Publication Data
US 2021/0157432 A1 May 27, 2021

(30) Foreign Application Priority Data
Nov. 21, 2019 (KR) .................. 10-2019-0150053

(51) Int. Cl.
*G06F 3/041* (2006.01)
*G06F 3/044* (2006.01)
*H01L 51/52* (2006.01)
*H01L 27/32* (2006.01)

(52) U.S. Cl.
CPC .......... *G06F 3/0412* (2013.01); *G06F 3/0418* (2013.01); *G06F 3/0446* (2019.05); *G06F 3/04164* (2019.05); *G06F 3/04166* (2019.05); *H01L 27/322* (2013.01); *H01L 27/323* (2013.01); *H01L 27/3244* (2013.01); *H01L 51/5253* (2013.01); *H01L 51/5284* (2013.01)

(58) Field of Classification Search
CPC . G06F 3/04164; G06F 3/04166; G06F 3/0446
See application file for complete search history.

(56) References Cited

U.S. PATENT DOCUMENTS

| 9,092,097 | B2 * | 7/2015 | Kang | .................... G06F 3/0446 |
| 11,011,203 | B1 * | 5/2021 | Chang | ................ G11B 20/1258 |
| 2019/0163314 | A1 * | 5/2019 | Kim | ...................... G06F 3/0446 |

\* cited by examiner

*Primary Examiner* — Michael Pervan
(74) *Attorney, Agent, or Firm* — Morgan, Lewis & Bockius LLP

(57) ABSTRACT

Embodiments of the disclosure relate to touch display devices. The difference in parasitic capacitance due to the difference in length between the touch routing lines may be reduced by separately arranging touch electrode lines in the active area and connecting the touch routing line connected with each portion of a touch electrode line with the touch routing line connected with each portion of another touch electrode line. Therefore, it is possible to reduce loads and the differences in touch sensing depending on the connection structure and position of the touch routing line by driving the touch electrode line in a double-routing structure. By so doing, the performance of touch sensing may be enhanced.

20 Claims, 22 Drawing Sheets

TOUCH DISPLAY DEVICE

CROSS-REFERENCE TO RELATED APPLICATION

This application claims priority from Korean Patent Application No. 10-2019-0150053, filed on Nov. 21, 2019 which is hereby incorporated by reference for all purposes as if fully set forth herein.

BACKGROUND

Technical Field

Embodiments of the disclosure relate to touch display devices.

Discussion of the Related Art

The growth of the intelligent society leads to increased demand for image display devices and use of various types of display devices, such as liquid crystal displays, organic light emitting displays, etc.

The display device recognizes the user's touch on the display panel and performs input processing based on the recognized touch so as to provide more various functions to the user.

As an example, a display device capable of touch recognition may include a plurality of touch electrodes arranged or embedded in a display panel. Whether there is the user's touch on the display panel and coordinates of a touch may be detected by driving the touch electrodes.

To display images and provide the touch sensing function, the display panel may include electrodes and lines for display driving and electrodes and lines for touch sensing. Thus, a parasitic capacitance may be generated between the display driving electrode and the touch sensing electrode, causing noise upon touch sensing.

A difference in parasitic capacitance between the display driving electrode and the touch sensing electrode may occur depending on the arrangement of touch electrodes or touch lines. The presence of a parasitic capacitance and a deviation in parasitic capacitance may deteriorate the performance of touch sensing.

SUMMARY

Accordingly, embodiments of the present disclosure are directed to a touch display device that substantially obviates one or more of the problems due to limitations and disadvantages of the related art.

Features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

According to an embodiment, there is provided a method for reducing noise upon touch sensing by decreasing the influence due to the parasitic capacitance between the display driving electrode and the touch sensing electrode.

According to an embodiment, there is provided a method for enhancing the performance of touch sensing by reducing the difference in noise depending on the arrangement position or structure of touch electrodes and touch routing lines.

According to an embodiment, a touch display device comprises a plurality of light emitting elements arranged in an active area, an encapsulation part disposed on the light emitting elements in the active area, a portion of the encapsulation part being disposed in a non-active area positioned outside the active area, a plurality of touch electrode lines arranged in the active area on the encapsulation part, and a plurality of touch routing lines arranged in the non-active area on the encapsulation part and electrically connected with the touch electrode lines.

The plurality of touch electrode lines may include a plurality of X-touch electrode lines arranged in a first direction and a plurality of Y-touch electrode lines arranged in a second direction crossing the first direction.

At least one touch electrode line among the X-touch electrode lines and the Y-touch electrode lines may include a first portion and a second portion separated from the first portion and disposed on a line where the first portion is disposed.

The plurality of touch routing lines may include a plurality of first lines electrically connected with the first portion of the touch electrode line and a plurality of second lines electrically connected with the second portion of the touch electrode line.

Each of the plurality of first lines may be electrically connected with a respective one of the plurality of second lines in an area except for the active area. At least one of the plurality of first lines may be electrically connected with a second line electrically connected with a second portion included in a touch electrode line except for a touch electrode line including a first portion electrically connected with the first line.

As an example, a first line electrically connected with a first portion of an ith touch electrode line may be electrically connected with a second line electrically connected with a second portion of a jth touch electrode line, where j is different from i.

A first line electrically connected with a first portion of the jth touch electrode line may be electrically connected with a second line electrically connected with a second portion of the ith touch electrode line.

According to an embodiment, a touch display device comprises a plurality of X-touch electrode lines arranged in a first direction, a plurality of Y-touch electrode lines arranged in a second direction crossing the first direction, and a plurality of touch routing lines electrically connected with the X-touch electrode line and the Y-touch electrode lines. At least one touch electrode line among the X-touch electrode lines and the Y-touch electrode lines includes a first portion and a second portion separated from the first portion and disposed on a line where the first portion is disposed. The plurality of touch routing lines include a plurality of first lines electrically connected with the first portion of the touch electrode line and a plurality of second lines electrically connected with the second portion of the touch electrode line. At least one of the plurality of first lines is electrically connected with a second line electrically connected with a second portion included in a touch electrode line except for a touch electrode line including a first portion electrically connected with the first line.

According to an embodiment, a touch display device comprises a plurality of touch electrode lines arranged in a first active area and a plurality of touch electrode lines arranged in a second active area positioned on a side of the first active area and separated from the touch electrode lines arranged in the first active area. An ith touch electrode line disposed in the first active area and a jth touch electrode line disposed in the second active area are simultaneously driven, and a jth touch electrode line disposed in the first active area and an ith touch electrode line disposed in the second active area are simultaneously driven, where i differs from j.

According to various embodiments, it is possible to allow the whole length of the touch routing line to be a predetermined value or fall within a predetermined range by shorting the touch routing lines connected with the touch electrode lines separated from each other and disposed in different rows or columns.

Thus, it is possible to reduce the difference in parasitic capacitance due to the differences in length of the touch routing lines depending on the position of the touch electrode line connected.

As the portions where the touch electrode lines are separated from each other in the active area may be distributed, it is possible to enhance the performance of touch sensing while minimizing the deterioration of touch sensing due to the portions where the touch electrode lines are separated from each other.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
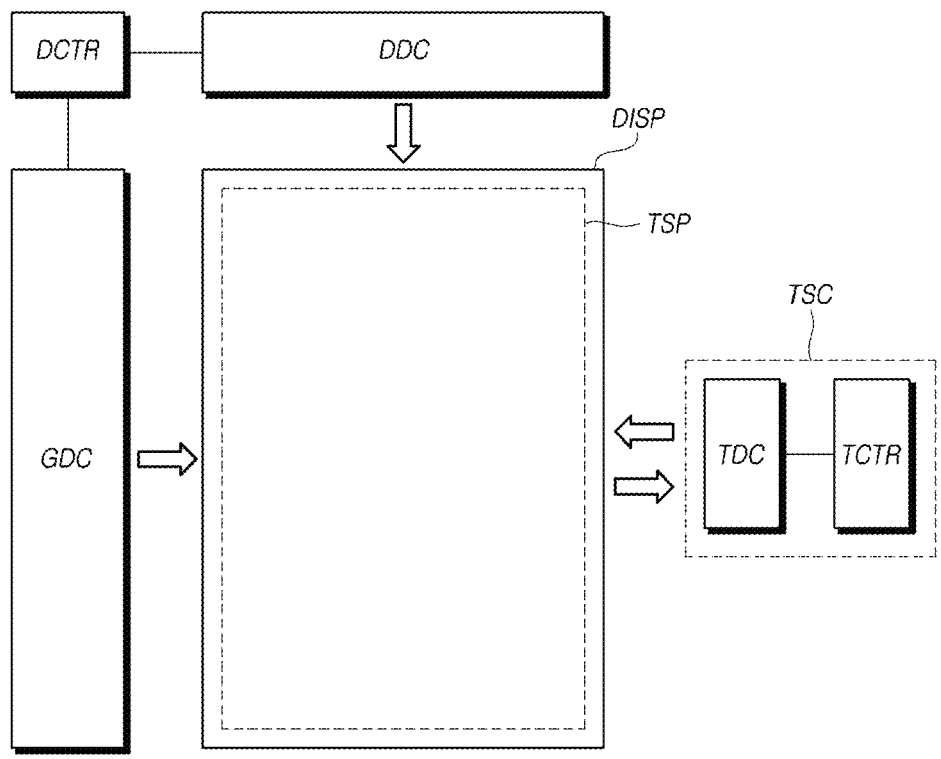
FIG. 1 is a view schematically illustrating a system configuration of a touch display device according to an embodiment.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a view illustrating a system configuration of a touch display device according to an embodiment of the disclosure.

Referring to FIG. 1, according to an embodiment, the touch display device may provide both a function for displaying images and a function for touch sensing.

According to an embodiment, to provide the image display function, the touch display device may include a display panel DISP, where a plurality of data lines and a plurality of gate lines are arranged, and a plurality of subpixels defined by the plurality of data lines and the plurality of gate lines are arranged, a data driving circuit DDC for driving the plurality of data lines, a gate driving circuit GDC for driving the plurality of gate lines, and a display controller DCTR for controlling the data driving circuit DDC and the gate driving circuit GDC.

The data driving circuit DDC, the gate driving circuit GDC, and the display controller DCTR each may be implemented as one or more individual components. In some cases, two or more of the data driving circuit DDC, the gate driving circuit GDC, and the display controller DCTR may be integrated into a single component. For example, the data driving circuit DDC and the display controller DCTR may be implemented as a single integrated circuit (IC) chip.

According to an embodiment, to provide the touch sensing function, the touch display device may include a touch panel TSP including a plurality of touch electrodes and a touch sensing circuit TSC supplying touch driving signals to the touch panel TSP, detecting touch sensing signals from the touch panel TSP, and sensing whether there is the user's touch or the position of a touch (touch coordinates) on the touch panel TSP based on the detected touch sensing signals.

As an example, the touch sensing circuit TSC may include a touch driving circuit TDC supplying touch driving signals to the touch panel TSP and detecting touch sensing signals from the touch panel TSP and a touch controller TCTR sensing whether there is the user's touch on the touch panel TSP and/or the position of a touch based on the touch sensing signal detected by the touch driving circuit TDC.

The touch driving circuit TDC may include a first circuit part supplying touch driving signals to the touch panel TSP and a second circuit part detecting touch sensing signals from the touch panel TSP.

The touch driving circuit TDC and the touch controller TCTR may be implemented as separate components or, in some cases, be integrated into a single component.

The data driving circuit DDC, the gate driving circuit GDC, and the touch driving circuit TDC each may be implemented as one or more integrated circuits and, in light of electrical connection with the display panel DISP, they may be implemented in a chip-on-glass (COG) type, chip-on-film (COF) type, or tape-carrier-package (TCP) type. The gate driving circuit GDC may also be implemented in a gate-in-panel (GIP) type.

The circuit components (DDC, GDC, and DCTR) for display driving and the circuit components (TDC and TCTR) for touch sensing each may be implemented as one or more individual components. In some cases, one or more of the circuit components (DDC, GDC, and DCTR) for display driving and one or more of the circuit components (TDC and TCTR) for touch sensing may be functionally integrated into one or more components.

For example, the data driving circuit DDC and the touch driving circuit TDC may be integrated into one or two or more integrated circuit chips. Where the data driving circuit DDC and the touch driving circuit TDC are integrated into two or more integrated circuit chips, each of the two or more integrated circuit chips may have the data driving function and the touch driving function.

According to an embodiment, the touch display device may come in various types, e.g., as an organic light emitting display device or a liquid crystal display device. In the following example, the touch display device is an organic light emitting display device for ease of description. In other words, although the display panel DISP comes in various types, e.g., as an organic light emitting display panel or a liquid crystal display panel, an example is described below in which the display panel DISP is an organic light emitting display panel for ease of description.

As described below, the touch panel TSP may include a plurality of touch electrodes to which touch driving signals are applied or from which touch sensing signals may be detected and a plurality of touch routing lines for connecting the plurality of touch electrodes with the touch driving circuit TDC.

The touch panel TSP may be present outside the display panel DISP. In other words, the touch panel TSP and the display panel DISP may be separately manufactured and then combined together. Such touch panel TSP is referred to as an external type or add-on type.

Unlike this, the touch panel TSP may be embedded in the display panel DISP. In other words, when the display panel DISP is manufactured, the touch sensor structure of, e.g., the plurality of touch electrodes and the plurality of touch routing lines constituting the touch panel TSP, may be formed along with signal lines and electrodes for display driving. Such touch panel TSP is referred to as an embedded type. In the following example, the touch panel TSP is formed in the embedded type for ease of description.

Figure 2:
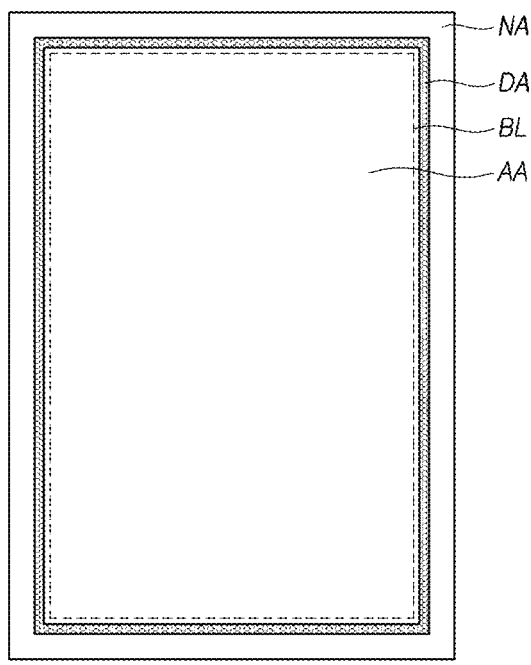
FIG. 2 is a view schematically illustrating a display panel of a touch display device according to an embodiment.

FIG. 2 is a view schematically illustrating a display panel DISP of a touch display device according to an embodiment.

Referring to FIG. 2, the display panel DISP may include an active area AA, where images are displayed, and a non-active area NA, which is an area around the outer border line BL of the active area AA.

In the active area AA of the display panel DISP, a plurality of subpixels for displaying images are arranged, and various electrodes or signal lines for display driving are arranged.

In the active area AA of the display panel DISP, a plurality of touch electrodes for touch sensing and a plurality of touch routing lines electrically connected with the touch electrodes may be arranged. Thus, the active area AA may also be referred to as a touch sensing area where touch sensing is possible.

In the non-active area NA of the display panel DISP, link lines, which are extensions of various signal lines arranged in the active area AA, or link lines electrically connected with various signal lines arranged in the active area AA, and pads electrically connected with the link lines may be arranged. The pads arranged in the non-active area NA may be bonded or electrically connected with the display driving circuit (e.g., DDC or GDC).

In the non-active area NA of the display panel DISP, link lines, which are extensions of the plurality of touch routing lines arranged in the active area AA, or link lines electrically connected with the plurality of touch routing lines arranged in the active area AA, and pads electrically connected with the link lines may be arranged. The pads arranged in the non-active area NA may be bonded or electrically connected with the touch driving circuit TDC.

In the non-active area NA, partial extensions of the outermost touch electrodes among the plurality of touch electrodes arranged in the active area AA may be present, and one or more electrodes (touch electrodes) which are formed of the same material as the plurality of touch electrodes arranged in the active area AA may further be disposed.

In other words, the plurality of touch electrodes arranged on the display panel DISP may all be present in the active area AA, or some (e.g., the outermost touch electrodes) of the plurality of touch electrodes arranged in the display panel DISP may be present in the non-active area NA, or some (e.g., the outermost touch electrodes) of the plurality of touch electrodes arranged on the display panel DISP may be provided over the active area AA and the non-active area NA.

Referring to FIG. 2, according to an embodiment, the display panel DISP of the touch display device may include a dam area DA where a dam DAM is placed to prevent any layer (e.g., the encapsulation part in the organic light emitting display panel) from collapsing in the active area AA.

The dam area DA may be positioned at the border between the active area AA and the non-active area NA or at any point in the non-active area NA which is positioned around the active area AA.

The dam disposed in the dam area DA may be disposed to surround the active area AA in all directions or be disposed around only one or two or more portions (e.g., portions with a layer which may easily collapse) in the active area AA.

The dam disposed in the dam area DA may be constituted of a single continuous pattern or two or more dams separated from each other. Only a primary dam, two dams (the primary dam and a secondary dam), or three or more dams may be disposed in the dam area DA.

In the dam area DA, the primary dam may be present in any one direction, or the primary dam and the secondary dam all may be present in any one direction.

Figure 3:
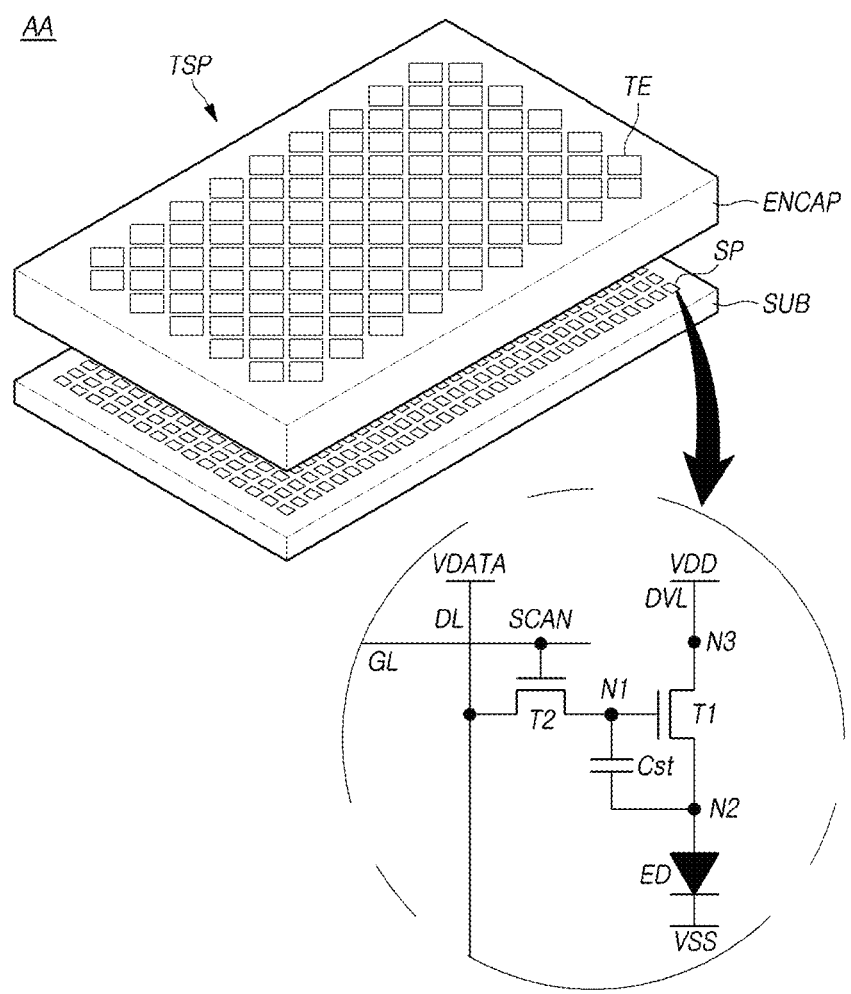
FIG. 3 is a view illustrating an example structure in which a touch panel is embedded in a display panel according to an embodiment.

FIG. 3 is a view illustrating an example structure in which a touch panel TSP is embedded in a display panel DISP according to an embodiment.

Referring to FIG. 3, in the active area AA of the display panel DISP, a plurality of subpixels SP may be arranged on the substrate SUB.

Each subpixel SP may include a light emitting element ED, a first transistor T1 for driving the light emitting element ED, a second transistor T2 for transferring a data voltage VDATA to a first node N1 of the first transistor T1, and a storage capacitor Cst for maintaining a constant voltage during one frame.

The first transistor T1 may include the first node N1 to which the data voltage VDATA may be applied, a second node N2 electrically connected with the light emitting element ED, and a third node N3 to which a driving voltage VDD is applied from a driving voltage line DVL. The first node N1 may be a gate node, the second node N2 may be a source node or a drain node, and the third node N3 may be the drain node or the source node. The first transistor T1 is referred to as a driving transistor for driving the light emitting element ED.

The light emitting element ED may include a first electrode (e.g., an anode electrode), a light emitting layer, and a second electrode (e.g., a cathode electrode). The first electrode may be electrically connected with the second node N2 of the first transistor T1, and a base voltage VSS may be applied to the second electrode.

The light emitting layer in the light emitting element ED may be an organic light emitting layer containing an organic material. In this case, the light emitting element ED may be an organic light emitting diode (OLED).

The second transistor T2 may be on/off controlled by a scan signal SCAN applied via the gate line GL and be electrically connected between the first node N1 of the first transistor T1 and the data line DL. The second transistor T2 is referred to as a switching transistor.

If the second transistor T2 is turned on by the scan signal SCAN, the data voltage VDATA supplied from the data line DL is transferred to the first node N1 of the first transistor T1.

The storage capacitor Cst may be electrically connected between the first node N1 and second node N2 of the first transistor T1.

Each subpixel SP may have a 2T1C structure which includes two transistors T1 and T2 and one capacitor Cst as shown in FIG. 3 and, in some cases, each subpixel SP may further include one or more transistors or one or more capacitors.

The storage capacitor Cst may be not the parasitic capacitor (e.g., Cgs or Cgd), the internal capacitor which may be present between the first node N1 and second node N2 of the first transistor T1, but an external capacitor intentionally designed outside the first transistor T1.

Each of the first transistor T1 and the second transistor T2 may be an n-type transistor or a p-type transistor.

As described above, circuit elements, such as the light emitting element ED, two or more transistors T1 and T2, and one or more capacitors Cst, are disposed on the display panel DISP. Since such circuit elements (particularly, the light emitting element ED) are vulnerable to external moisture or oxygen, an encapsulation part ENCAP may be disposed on the display panel DISP to prevent penetration of external moisture or oxygen into the circuit elements (particularly, the light emitting element ED).

The encapsulation part ENCAP may be a single layer or may include multiple layers.

In the touch display device according to an embodiment, the touch panel TSP may be formed on the encapsulation part ENCAP.

In other words, in the touch display device, the touch sensor structure, e.g., the plurality of touch electrodes TE constituting the touch panel TSP, may be disposed on the encapsulation part ENCAP.

Upon touch sensing, a touch driving signal or touch sensing signal may be applied to the touch electrode TE. Thus, upon touch sensing, an electric potential may be formed between the cathode electrode and the touch electrode TE disposed, with the encapsulation part ENCAP interposed therebetween, causing unnecessary parasitic capacitance. Since the parasitic capacitance may deteriorate touch sensitivity, the distance between the touch electrode TE and the cathode electrode may be designed to be a predetermined value (e.g., 1 μm) or more considering, e.g., panel thickness, panel manufacturing process, and display performance, so as to reduce the parasitic capacitance. To that end, the thickness of the encapsulation part ENCAP may be at least 1 μm or more, as an example.

Figure 4:
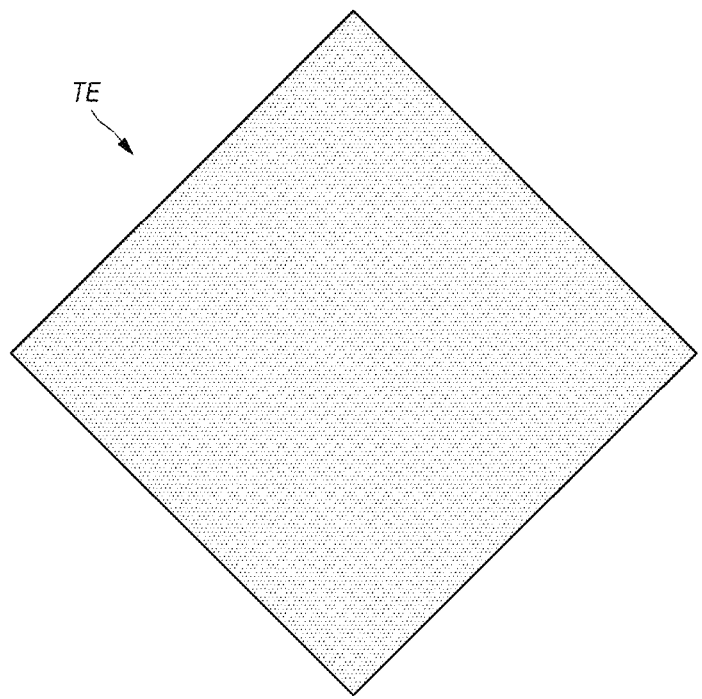
FIGS. 4 and 5 are views illustrating example types of touch electrodes disposed on a display panel according to an embodiment.
Figure 5:
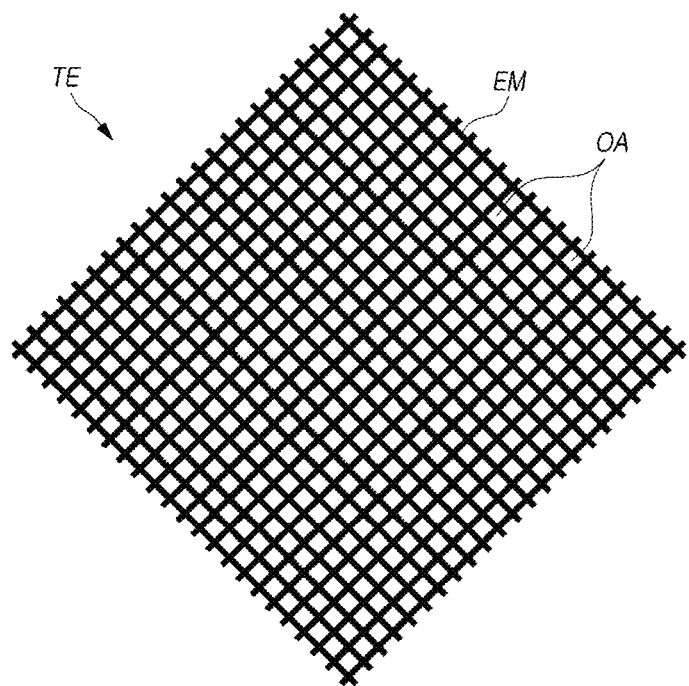

FIGS. 4 and 5 are views illustrating example types of touch electrodes TE disposed on a display panel DISP according to an embodiment.

As shown in FIG. 4, each touch electrode TE disposed on the display panel DISP may be a plate-shape electrode metal with no opening. In this case, each touch electrode TE may be a transparent electrode. In other words, each touch electrode TE may be formed of a transparent electrode material to allow the light emitted from the plurality of subpixel SPs disposed thereunder to be transmitted upwards.

Unlike this, each touch electrode TE disposed on the display panel DISP may be an electrode metal EM with two or more openings OA, which is patterned in a mesh type.

The electrode metal EM is a part corresponding to the substantial touch electrode TE, to which the touch driving signal is applied or from which the touch sensing signal is detected.

As shown in FIG. 5, where each touch electrode TE is an electrode metal EM patterned in a mesh type, two or more openings OA may be present in the area of the touch electrode TE.

Each of the two or more openings OA present in each touch electrode TE may correspond to the light emitting area of one or more subpixels SP. In other words, the plurality of openings OA serve as a path along which the light emitted from the plurality of subpixels SP disposed thereunder are passed upwards. An example in which each touch electrode TE is a mesh-type electrode metal EM is described below for ease of description.

The electrode metal EM corresponding to each touch electrode TE may be positioned on the bank which is disposed in a non-light emitting area of the two or more subpixels SP.

As a method for forming several touch electrodes TE, after the electrode metal EM is formed broad in a mesh type, the electrode metal EM may be cut into a predefined pattern to electrically separate the electrode metal EM, forming several touch electrodes TE.

The contour of the touch electrode TE may be shaped as a diamond or rhombus as shown in FIGS. 4 and 5, or may come in other various shapes, such as a triangle, pentagon, or hexagon.

Figure 6:
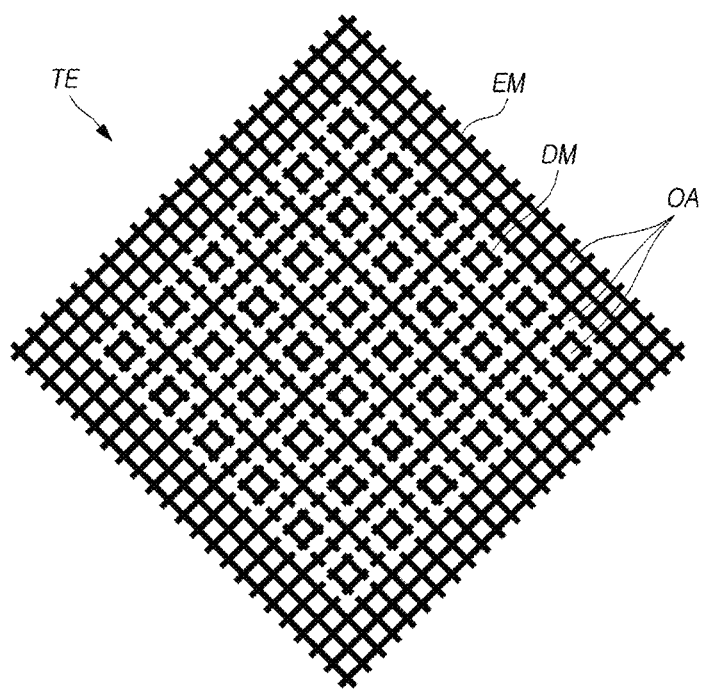
FIG. 6 is a view illustrating an example mesh-type touch electrode as shown in FIG. 5.

FIG. 6 is a view illustrating an example mesh-type touch electrode TE as shown in FIG. 5.

Referring to FIG. 6, in the area of each touch electrode TE, one or more dummy metals DM disconnected from the mesh-type electrode metal EM may be present.

The electrode metal EM is a part corresponding to the substantial touch electrode TE and is a part to which the touch driving signal is applied or from which the touch sensing signal is detected. The dummy metal DM, although present in the area of the touch electrode TE, has no touch driving signal applied thereto and no touch sensing signal detected therefrom. In other words, the dummy metal DM may be a metal electrically floated.

Thus, although the electrode metal EM is electrically connected with the touch driving circuit TDC, the dummy metal DM is not electrically connected with the touch driving circuit TDC.

In the area of each of all the touch electrodes TE, one or more dummy metals DM may be present, with them disconnected from the electrode metal EM.

Unlike this, only in the area of each of some of all the touch electrodes TE, one or more dummy metals DM may be present, with them disconnected from the electrode metal EM. In other words, in the area of some touch electrodes TE, no dummy metal DM may be present.

In relation to the role of the dummy metal DM, in the case where one or more dummy metals DM are absent and only the electrode metal EM is present in a mesh type in the area of the touch electrode TE as shown in FIG. 5, a visibility issue may arise in which the contour of the electrode metal EM is shown on the screen.

In contrast, where one or more dummy metals DM are present in the area of the touch electrode TE as shown in FIG. 6, the visibility issue that the contour of the electrode metal EM is shown on the screen may be prevented.

The magnitude of capacitance may be adjusted per touch electrode TE by adjusting the presence or absence of dummy metal DM or the number (dummy metal ratio) of dummy metals DM per touch electrode TE, thereby enhancing touch sensitivity.

The electrode metal EM formed in the area of one touch electrode TE may be cut at some spots, forming the dummy metals DM. In other words, the electrode metal EM and the dummy metal DM may be formed of the same material on the same layer.

According to an embodiment, the touch display device may sense touches based on the capacitance formed at the touch electrode TE.

The touch display device according to embodiments of the disclosure may sense a touch in a mutual capacitance-based touch sensing scheme or self capacitance-based touch sensing scheme, as the capacitance-based touch sensing scheme.

In the mutual-capacitance-based touch sensing scheme, the plurality of touch electrodes TE may be divided into a driving touch electrode (transmission touch electrode) to which the touch driving signal is applied and a sensing touch electrode (reception touch electrode) from which the touch sensing signal is detected and which forms a capacitance with the driving touch electrode.

In the mutual-capacitance-based touch sensing scheme, the touch sensing circuit TSC senses whether there is a touch and/or the coordinates of a touch based on variations in the capacitance (mutual-capacitance) between the driving touch electrode and the sensing touch electrode according to whether there is a pointer, such as a finger or pen.

In the self-capacitance-based touch sensing scheme, each touch electrode TE plays a role both as a driving touch electrode and as a sensing touch electrode. In other words, the touch sensing circuit TSC applies the touch driving signal to one or more touch electrodes TE, detects the touch sensing signal via the touch electrode TE to which the touch driving signal has been applied, grasps a variation in the capacitance between the touch electrode TE and the pointer, e.g., a finger or pen, based on the detected touch sensing signal, and senses whether there is a touch and/or the coordinates of a touch. In the self-capacitance-based touch sensing scheme, the driving touch electrode and the sensing touch electrode are not distinguished from each other.

As such, the touch display device according to embodiments of the disclosure may sense a touch in the mutual capacitance-based touch sensing scheme or self capacitance-based touch sensing scheme. In the following example, the touch display device performs mutual-capacitance-based touch sensing and has a touch sensor structure for the same, for ease of description.

Figure 7:
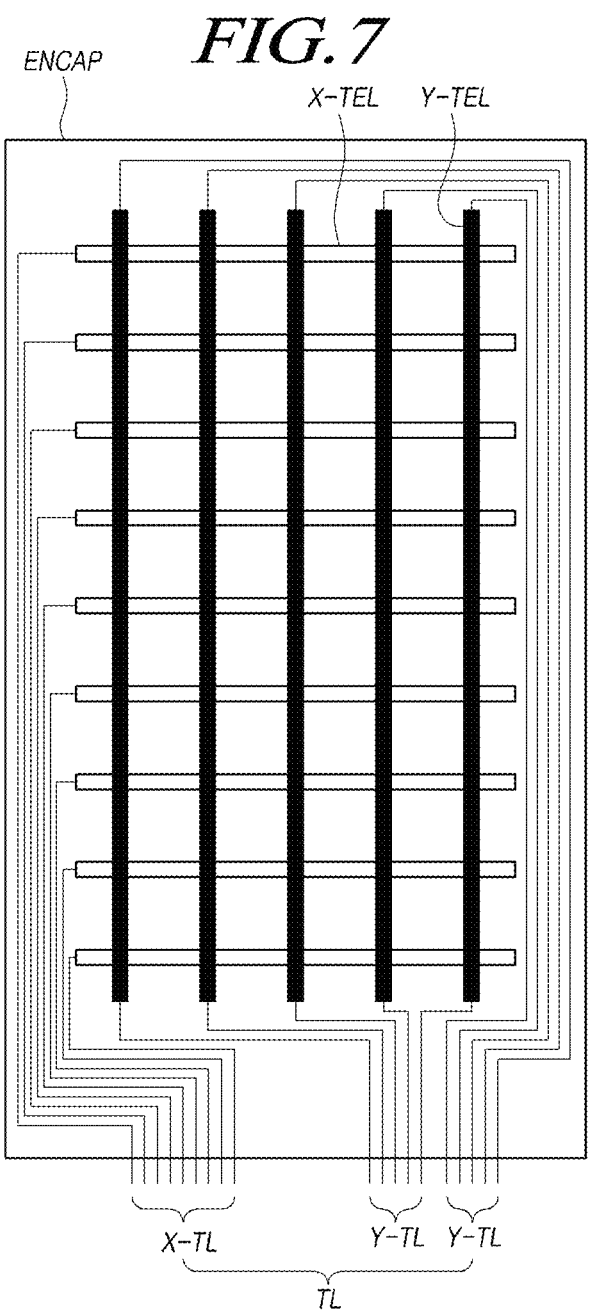
FIG. 7 is a view schematically illustrating a touch sensor structure in a display panel according to an embodiment.
Figure 8:
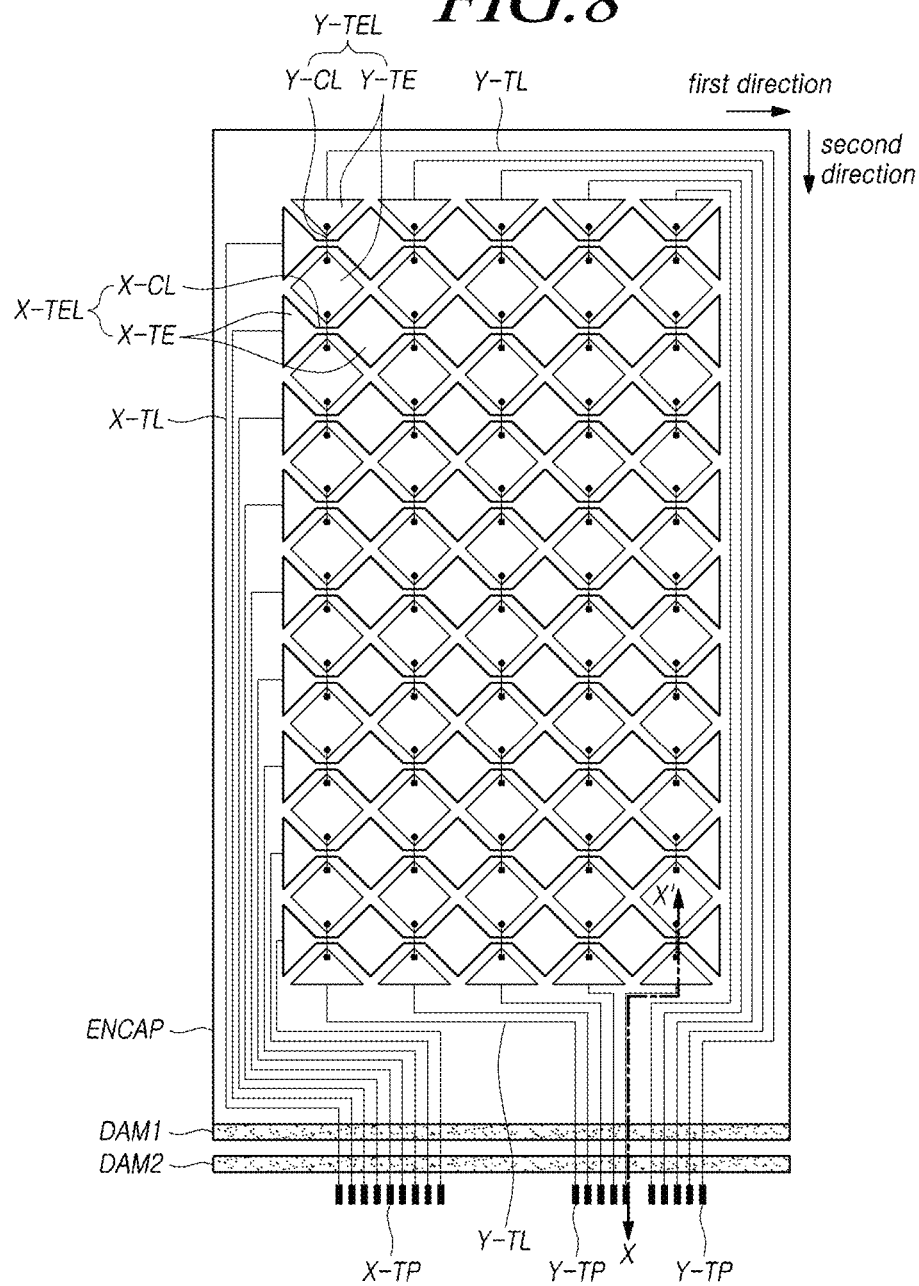
FIG. 8 is a view illustrating an example touch sensor structure as shown in FIG. 7.

FIG. 7 is a view schematically illustrating a touch sensor structure in a display panel DISP according to an embodiment. FIG. 8 is a view illustrating an example touch sensor structure as shown in FIG. 7.

Referring to FIG. 7, a touch sensor structure for mutual-capacitance-based touch sensing may include a plurality of X-touch electrode lines X-TEL and a plurality of Y-touch electrode lines Y-TEL. The plurality of X-touch electrode lines X-TEL and the plurality of Y-touch electrode lines Y-TEL are positioned on the encapsulation part ENCAP.

Each of the plurality of X-touch electrode lines X-TEL may be disposed in a first direction, and each of the plurality of Y-touch electrode lines Y-TEL may be disposed in a second direction different from the first direction.

In the disclosure, the first direction and the second direction may be relatively different directions. As an example, the first direction may be the x-axis direction, and the second direction may be the y-axis direction. In contrast, the first direction may be the y-axis direction, and the second direction may be the x-axis direction. The first direction and the second direction may be, or may not be, perpendicular to each other. In the disclosure, row and column are relative terms, and from a point of view, the terms "row" and "column" may be interchangeably used.

Each of the X-touch electrode lines X-TEL may be constituted of a plurality of X-touch electrodes X-TE electrically connected with each other. Each of the Y-touch electrode lines Y-TEL may be constituted of a plurality of Y-touch electrodes Y-TE electrically connected with each other.

The plurality of X-touch electrodes X-TE and the plurality of Y-touch electrodes Y-TE are electrodes which are included in the plurality of touch electrodes TE and have separate roles (functions) from each other.

For example, the plurality of X-touch electrodes X-TE constituting each of the plurality of X-touch electrode lines X-TEL may be driving touch electrodes, and the plurality of Y-touch electrodes Y-TE constituting each of the plurality of Y-touch electrode lines Y-TEL may be sensing touch electrodes. In this case, each of the plurality of X-touch electrode lines X-TEL corresponds to the driving touch electrode line, and each of the plurality of Y-touch electrode lines Y-TEL corresponds to the sensing touch electrode line.

In contrast, the plurality of X-touch electrodes X-TE constituting each of the plurality of X-touch electrode lines X-TEL may be sensing touch electrodes, and the plurality of Y-touch electrodes Y-TE constituting each of the plurality of Y-touch electrode lines Y-TEL may be driving touch electrodes. In this case, each of the plurality of X-touch electrode lines X-TEL corresponds to the sensing touch electrode line, and each of the plurality of Y-touch electrode lines Y-TEL corresponds to the driving touch electrode line.

A touch sensor metal for touch sensing may include a plurality of touch routing lines TL as well as the plurality of X-touch electrode lines X-TEL and the plurality of Y-touch electrode lines Y-TEL.

The plurality of touch routing lines TL may include one or more X-touch routing lines X-TL connected with each of the plurality of X-touch electrode lines X-TEL and one or more Y-touch routing lines Y-TL connected with each of the plurality of Y-touch electrode lines Y-TEL.

Referring to FIG. 8, each of the plurality of X-touch electrode lines X-TEL may include a plurality of X-touch electrodes X-TE arranged in the same row (or column) and one or more X-touch electrode connection lines X-CL electrically connecting the same. The X-touch electrode connection line X-CL connecting two adjacent X-touch electrodes X-TE may be a metal integrated with two adjacent X-touch electrodes X-TE (the example of FIG. 8) or be a metal connected with two adjacent X-touch electrodes X-TE via a contact hole.

Each of the plurality of Y-touch electrode lines Y-TEL may include a plurality of Y-touch electrodes Y-TE arranged in the same column (or row) and one or more Y-touch electrode connection lines Y-CL electrically connecting the same. The Y-touch electrode connection line Y-CL connecting two adjacent Y-touch electrodes Y-TE may be a metal integrated with two adjacent Y-touch electrodes Y-TE or be a metal connected with two adjacent Y-touch electrodes Y-TE via a contact hole (the example of FIG. 8).

In the crossing area (touch electrode line crossing area) of the X-touch electrode line X-TEL and the Y-touch electrode line Y-TEL, the X-touch electrode connection line X-CL and the Y-touch electrode connection line Y-CL may cross each other.

In this case, in the crossing area (touch electrode line crossing area) of the X-touch electrode line X-TEL and the Y-touch electrode line Y-TEL, the X-touch electrode connection line X-CL and the Y-touch electrode connection line Y-CL may cross each other.

As such, where the X-touch electrode connection line X-CL and the Y-touch electrode connection line Y-CL cross each other in the touch electrode line crossing area, the X-touch electrode connection line X-CL and the Y-touch electrode connection line Y-CL may be needed to be placed on different layers.

Thus, to cross the plurality of X-touch electrode lines X-TEL and the plurality of Y-touch electrode lines Y-TEL, the plurality of X-touch electrodes X-TE, the plurality of X-touch electrode connection lines X-CL, the plurality of Y-touch electrodes Y-TE, and the plurality of Y-touch electrode connection lines Y-CL may be positioned on two or more layers.

Referring to FIG. 8, each of the plurality of X-touch electrode lines X-TEL is electrically connected with the corresponding X-touch pad X-TP via one or more X-touch routing lines X-TL. In other words, the outermost X-touch electrode X-TE among the plurality of X-touch electrodes X-TE included in one X-touch electrode line X-TEL is electrically connected with the X-touch pad X-TP via the X-touch routing line X-TL.

Each of the plurality of Y-touch electrode lines Y-TEL is electrically connected with the corresponding Y-touch pad Y-TP via one or more Y-touch routing lines Y-TL. In other words, the outermost Y-touch electrode Y-TE among the plurality of Y-touch electrodes Y-TE included in one Y-touch electrode line Y-TEL is electrically connected with the Y-touch pad Y-TP via the Y-touch routing line Y-TL.

As shown in FIG. 8, the plurality of X-touch electrode lines X-TEL and the plurality of Y-touch electrode lines Y-TEL may be disposed on the encapsulation part ENCAP. In other words, the plurality of X-touch electrode connection lines X-CL and the plurality of X-touch electrodes X-TE constituting the plurality of X-touch electrode lines X-TEL may be disposed on the encapsulation part ENCAP. The plurality of Y-touch electrode connection lines Y-CL and the plurality of Y-touch electrodes Y-TE constituting the plurality of Y-touch electrode lines Y-TEL may be disposed on the encapsulation part ENCAP.

As shown in FIG. 8, each of the plurality of X-touch routing lines X-TL electrically connected with the plurality of X-touch electrode lines X-TEL may be disposed on the encapsulation part ENCAP and extend up to where the encapsulation part ENCAP is absent, and be electrically connected with the plurality of X-touch pads X-TP. Each of the plurality of Y-touch routing lines Y-TL electrically connected with the plurality of Y-touch electrode lines Y-TEL may be disposed on the encapsulation part ENCAP and extend up to where the encapsulation part ENCAP is absent, and be electrically connected with the plurality of Y-touch pads Y-TP. The encapsulation part ENCAP may be positioned in the active area AA and, in some cases, extend up to the non-active area NA.

As described above, to prevent any layer (e.g., the encapsulation part in the OLED panel) in the active area AA from collapsing, the dam area DA may be present in the border area between the active area AA and the non-active area NA or in the non-active area NA which is positioned around the active area AA.

As shown in FIG. 8, a primary dam DAM1 and a secondary dam DAM2 may be disposed in the dam area DA, as an example. The secondary dam DAM2 may be positioned further outside the primary dam DAM1.

Unlike in the example shown in FIG. 8, only the primary dam DAM1 may be positioned in the dam area DA or, in some cases, one or more dams may be disposed in addition to the primary dam DAM1 and the secondary dam DAM2.

Referring to FIG. 8, the encapsulation part ENCAP may be positioned on a side of the primary dam DAM1 or be positioned on the top as well as on a side of the primary dam DAM1.

Figure 9:
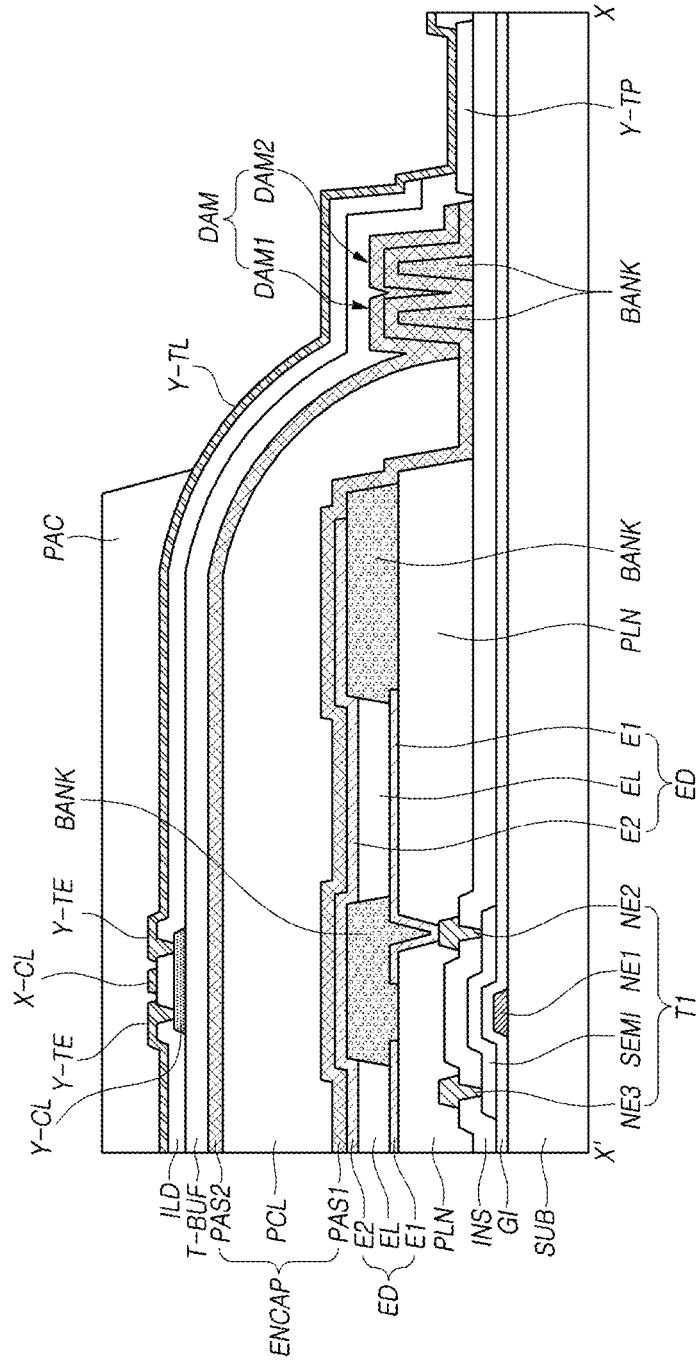
FIG. 9 is a partial cross-sectional view illustrating a display panel, taken along line X-X' of FIG. 8, according to an embodiment.

FIG. 9 is a partial cross-sectional view illustrating a display panel DISP, taken along line X-X' of FIG. 8, according to an embodiment. FIG. 9 illustrates a plate-shaped touch electrode TE, but this is merely an example. For example, a mesh-type touch electrode TE may be used. Where the touch electrode TE comes in a mesh type, the opening OA of the touch electrode TE may be positioned on the light emitting area of the subpixel SP.

In each subpixel SP in the active area AA, the first transistor T1, which is the driving transistor, is disposed on the substrate SUB.

The first transistor T1 includes a first node electrode NE1, which corresponds to the gate electrode, a second node electrode NE2, which corresponds to the source electrode or drain electrode, a third node electrode NE3, which corresponds to the drain electrode or source electrode, and a semiconductor layer SEMI.

The first node electrode NE1 and the semiconductor layer SEMI may overlap each other, with a gate insulation film GI disposed therebetween. The second node electrode NE2 may be formed on an insulation layer INS to contact one side of the semiconductor layer SEMI, and the third node electrode NE3 may be formed on the insulation layer INS to contact the other side of the semiconductor layer SEMI.

The light emitting element ED may include a first electrode E1, which corresponds to the anode electrode (or cathode electrode), a light emitting layer EL formed on the first electrode E1, and a second electrode E2 formed on the light emitting layer EL and corresponding to the cathode electrode (or anode electrode).

The first electrode E1 is electrically connected with the second node electrode NE2 of the first transistor T1, exposed through a pixel contact hole which passes through a planarization layer PLN.

The light emitting layer EL is formed on the first electrode E1 in a light emitting area prepared by a bank BANK. The light emitting layer EL is formed in the order of hole-related layer, light emitting layer, and electron-related layer, or its reverse order, on the first electrode E1. The second electrode E2 is formed to face the first electrode E1, with the light emitting layer EL disposed therebetween.

The encapsulation part ENCAP blocks penetration of external moisture or oxygen into the light emitting element ED which is vulnerable to external moisture or oxygen.

The encapsulation part ENCAP may be a single layer or may include a plurality of layers PAS1, PCL, and PAS2 as shown in FIG. 9.

For example, where the encapsulation part ENCAP is formed of multiple layers PAS1, PCL, and PAS2, the encapsulation part ENCAP may include one or more inorganic encapsulation layers PAS1 and PAS2 and one or more organic encapsulation layer PCL. As a specific example, the encapsulation part ENCAP may have a structure in which a first inorganic encapsulation layer PAS1, the organic encapsulation layer PCL, and the second inorganic encapsulation layer PAS2 are stacked in the order thereof.

The organic encapsulation layer PCL may further include at least one organic encapsulation layer or at least one inorganic encapsulation layer.

The first inorganic encapsulation layer PAS1 is formed on the substrate SUB where the second electrode E2 corresponding to the cathode electrode is formed, to be positioned most adjacent to the light emitting element ED. The first inorganic encapsulation layer PAS1 is formed of an inorganic insulation material capable of low-temperature deposition, such as, e.g., silicon nitride (SiNx), silicon oxide (SiOx), silicon oxynitride (SiON), or aluminum oxide ($Al_2O_3$). Since the first inorganic encapsulation layer PAS1 is deposed at low-temperature atmosphere, the first inorganic encapsulation layer PAS1 may prevent damage to the light emitting layer EL including the organic material vulnerable to high-temperature atmosphere upon deposition.

The organic encapsulation layer PCL may be formed in a smaller area than the first inorganic encapsulation layer PAS1 in which case the organic encapsulation layer PCL may be formed to expose both end tips of the first inorganic encapsulation layer PAS1. The organic encapsulation layer PCL serves to mitigate stress between the layers due to a warping of the touch display device which is an OLED device, while reinforcing the planarization performance. The organic encapsulation layer PCL may be formed of, e.g., an acrylic resin, epoxy resin, polyimide, polyethylene, silicon oxycarbonate (SiOC), or other organic insulation materials.

Where the organic encapsulation layer PCL is formed in an inkjet method, one or two dams DAM may be formed in the border area between the non-active area NA and the active area AA or the dam area DA which is a portion of the non-active area NA.

For example, as shown in FIG. 9, the dam area DA may be positioned between the active area AA and the pad area, where the plurality of X-touch pads X-TP and the plurality of Y-touch pads Y-TP are formed in the non-active area NA and, in the dam area DA, a primary dam DAM1 adjacent to the active area AA and a secondary dam DAM2 adjacent to the pad area may be present.

The one or more dams DAM disposed in the dam area DA may prevent the liquid-state organic encapsulation layer PCL from collapsing to the non-active area NA and resultantly penetrating into the pad area when the liquid-phase organic encapsulation layer PCL is dropped to the active area AA.

This effect may be increased when the primary dam DAM1 and the secondary dam DAM2 are provided as shown in FIG. 9.

The primary dam DAM1 and/or the secondary dam DAM2 may be formed in a single-layer structure or multi-layer structure. For example, the primary dam DAM1 and/or the secondary dam DAM2 may simultaneously be formed of the same material as at least one of the bank BANK and a spacer (not shown). In this case, a dam structure may be formed without a masking process or cost rise.

The primary dam DAM1 and/or the secondary dam DAM2 may be structured so that the first inorganic encapsulation layer PAS1 and/or the second inorganic encapsulation layer PAS2 are stacked on the bank BANK as shown in FIG. 9.

The organic encapsulation layer PCL including an organic material may be positioned only on an inside surface of the primary dam DAM1 as shown in FIG. 9.

Unlike this, the organic encapsulation layer PCL containing an organic material may also be positioned on the top of at least a portion of the primary dam DAM1 and the secondary dam DAM2. As an example, the organic encapsulation layer PCL may also be positioned on the top of the primary dam DAM1.

The second inorganic encapsulation layer PAS2 may be formed to cover the respective top surfaces and side surfaces of the organic encapsulation layer PCL and the first inorganic encapsulation layer PAS1, on the substrate SUB where the organic encapsulation layer PCL is formed. The second inorganic encapsulation layer PAS2 minimizes or blocks penetration of external moisture or oxygen into the first inorganic encapsulation layer PAS1 and the organic encapsulation layer PCL. The second inorganic encapsulation layer PAS2 is formed of an inorganic insulation material, such as, e.g., silicon nitride (SiNx), silicon oxide (SiOx), silicon oxynitride (SiON), or aluminum oxide ($Al_2O_3$).

A touch buffer film T-BUF may be disposed on the encapsulation part ENCAP. The touch buffer film T-BUF may be positioned between the second electrode E2 of the light emitting element ED and the touch sensor metal including the X-touch electrodes X-TE, the Y-touch electrodes Y-TE, the X-touch electrode connection lines X-CL, and the Y-touch electrode connection lines Y-CL.

The touch buffer film T-BUF may be designed to maintain a predetermined minimum spacing (e.g., 1 µm) between the touch sensor metal and the second electrode E2 of the light emitting element ED. Thus, it is possible to reduce or prevent the parasitic capacitance formed between the touch sensor metal and the second electrode E2 of the light emitting element ED and hence prevent deterioration of touch sensitivity due to parasitic capacitance.

It is also possible to place the touch sensor metal including the X-touch electrodes X-TE, the Y-touch electrodes Y-TE, the X-touch electrode connection lines X-CL, and the Y-touch electrode connection lines Y-CL, on the encapsulation part ENCAP, without the touch buffer film T-BUF.

The touch buffer film T-BUF may block off penetration, into the organic material-containing light emitting layer EL, of external moisture or the chemical (e.g., developer or etchant) used upon manufacturing the touch sensor metal disposed on the touch buffer film T-BUF. Thus, the touch buffer film T-BUF may prevent damage to the light emitting layer EL vulnerable to chemicals or moisture.

The touch buffer film T-BUF is formed of an organic insulation material with a low permittivity of 1 to 3 and formed at a low temperature which is not more than a predetermined temperature (e.g., 100° C.) to prevent damage to the light emitting layer EL containing the organic material vulnerable to high temperature. For example, the touch buffer film T-BUF may be formed of an acrylic-based, epoxy-based, or siloxane-based material. The touch buffer film T-BUF with planarization characteristics, formed of an organic insulation material, may prevent fracture of the touch sensor metal formed on the touch buffer film T-BUF and damage to the encapsulation layers PAS1, PCL, and PAS2 constituting the encapsulation part ENCAP due to a warping of the OLED device.

According to a mutual-capacitance-based touch sensor structure, the X-touch electrode line X-TEL and the Y-touch electrode line Y-TEL may be formed on the touch buffer film T-BUF, and the X-touch electrode line X-TEL and the Y-touch electrode line Y-TEL may be disposed to cross each other.

The Y-touch electrode line Y-TEL may include the plurality of Y-touch electrodes Y-TE and the plurality of Y-touch electrode connection lines Y-CL electrically connecting the plurality of Y-touch electrodes Y-TE.

As shown in FIG. 9, the plurality of Y-touch electrodes Y-TE and the plurality of Y-touch electrode connection lines Y-CL may be positioned on different layers, with a touch insulation film ILD disposed therebetween.

The plurality of Y-touch electrodes Y-TE may be spaced apart at a predetermined interval along the y axis direction. Each of the plurality of Y-touch electrodes Y-TE may be electrically connected with another Y-touch electrode Y-TE adjacent thereto in the y axis direction via the Y-touch electrode connection line Y-CL.

The Y-touch electrode connection line Y-CL may be formed on the touch buffer film T-BUF and be exposed via the touch contact hole passing through the touch insulation film ILD and be electrically connected with two Y-touch electrodes Y-TE adjacent in the y axis direction.

The Y-touch electrode connection line Y-CL may be disposed to overlap the bank BANK. Thus, it is possible to prevent a reduction in the aperture ratio due to the Y-touch electrode connection line Y-CL.

The X-touch electrode line X-TEL may include the plurality of X-touch electrodes X-TE and the plurality of X-touch electrode connection lines X-CL electrically connecting the plurality of X-touch electrodes X-TE. The plurality of X-touch electrodes X-TE and the plurality of X-touch electrode connection lines X-CL may be positioned on different layers, with a touch insulation film ILD disposed therebetween.

The plurality of X-touch electrodes X-TE may be spaced apart at a predetermined interval along the x axis direction. Each of the plurality of X-touch electrodes X-TE may be electrically connected with another X-touch electrode X-TE adjacent thereto in the x axis direction via the X-touch electrode connection line X-CL.

The X-touch electrode connection line X-CL may be disposed on the same plane as the X-touch electrode X-TE and be electrically connected with two X-touch electrodes X-TE adjacent thereto in the x axis direction without a separate contact hole or be integrated with the two X-touch electrodes X-TE adjacent thereto each other in the x axis direction.

The X-touch electrode connection line X-CL may be disposed to overlap the bank BANK. Thus, it is possible to prevent a reduction in the aperture ratio due to the X-touch electrode connection line X-CL.

The Y-touch electrode line Y-TEL may be electrically connected with the touch driving circuit TDC via the Y-touch routing line Y-TL and the Y-touch pad Y-TP. Likewise, the X-touch electrode line X-TEL may be electrically connected with the touch driving circuit TDC via the X-touch routing line X-TL and the X-touch pad X-TP.

A pad cover electrode may be further provided to cover the X-touch pad X-TP and the Y-touch pad Y-TP.

The X-touch pad X-TP may be formed separately from the X-touch routing line X-TL or may extend from the X-touch routing line X-TL. The Y-touch pad Y-TP may be formed separately from the Y-touch routing line Y-TL or may extend from the Y-touch routing line Y-TL.

Where the X-touch pad X-TP extends from the X-touch routing line X-TL, and the Y-touch pad Y-TP extends from the Y-touch routing line Y-TL, the X-touch pad X-TP, the X-touch routing line X-TL, the Y-touch pad Y-TP, and the Y-touch routing line Y-TL may be formed of the same first conductive material. The first conductive material may be formed in a single-layer or multi-layer structure using a metal with good corrosion or acid resistance or electric conductivity, such as Al, Ti, Cu, or Mo.

For example, the X-touch pad X-TP, X-touch routing line X-TL, Y-touch pad Y-TP, and Y-touch routing line Y-TL formed of the first conductive material may be formed in a three-layer stacked structure, such as Ti/Al/Ti or Mo/Al/Mo.

The pad cover electrode capable of covering the X-touch pad X-TP and Y-touch pad Y-TP may be formed of a second conductive material which is the same material as the X-touch electrode and Y-touch electrode X-TE and Y-TE. The second conductive material may be formed of a transparent conductive material, such as ITO or IZO, which has high corrosion or acid resistance. The pad cover electrode may be formed to be exposed by the touch buffer film T-BUF and be thus bonded with the touch driving circuit TDC or a circuit film where the touch driving circuit TDC is mounted.

The touch buffer film T-BUF may be formed to cover the touch sensor metal, preventing corrosion to the touch sensor metal by external moisture. As an example, the touch buffer film T-BUF may be formed of an organic insulation material or epoxy or acrylic film. The touch buffer film T-BUF on the encapsulation part ENCAP may be omitted. In other words, the touch buffer film T-BUF may not be an essential component.

The Y-touch routing line Y-TL may be electrically connected with the Y-touch electrode Y-TE via the touch routing line contact hole or be integrated with the Y-touch electrode Y-TE.

The Y-touch routing line Y-TL may extend up to the non-active area NA and be electrically connected with the Y-touch pad Y-TP via the top and side of the encapsulation part ENCAP and the top and side of the dam DAM. Thus, the Y-touch routing line Y-TL may be electrically connected with the touch driving circuit TDC via the Y-touch pad Y-TP.

The Y-touch routing line Y-TL may transfer the touch sensing signal from the Y-touch electrode Y-TE to the touch driving circuit TDC or may receive the touch driving signal from the touch driving circuit TDC and transfer the touch driving signal to the Y-touch electrode Y-TE.

The X-touch routing line X-TL may be electrically connected with the X-touch electrode X-TE via the touch routing line contact hole or may be integrated with the X-touch electrode X-TE.

The X-touch routing line X-TL may extend up to the non-active area NA and be electrically connected with the X-touch pad X-TP via the top and side of the encapsulation part ENCAP and the top and side of the dam DAM. Thus, the X-touch routing line X-TL may be electrically connected with the touch driving circuit TDC via the X-touch pad X-TP.

The X-touch routing line X-TL may receive the touch driving signal form the touch driving circuit TDC and transfer the touch driving signal to the X-touch electrode X-TE and may transfer the touch sensing signal from the X-touch electrode X-TE to the touch driving circuit TDC.

The arrangement of the X-touch routing line X-TL and the Y-touch routing line Y-TL may be varied depending on panel design specifications.

A touch protection film PAC may be disposed on the X-touch electrode X-TE and the Y-touch electrode Y-TE. The touch protection film PAC may extend up to before or after the dam DAM and may thus be disposed even on the X-touch routing line X-TL and the Y-touch routing line Y-TL.

The cross-sectional view of FIG. 9 illustrates a conceptual structure. Depending on the direction or position in which it is viewed, the position, thickness, or width of each pattern (e.g., various layers or electrodes) may be varied, and the connection structure of various patterns may be varied, and an additional layer other than the layers shown may be present as well, or some of the layers may be omitted or combined. For example, the width of the bank BANK may be narrower than that shown in the drawings, and the height of the dam DAM may be higher or lower than that shown.

In FIG. 9, the touch electrode TE or touch routing line TL is overall disposed on the subpixel SP to represent an example structure of being connected to the touch pad TP along the inclined surface of the encapsulation part ENCAP and the touch routing line TL. However, if the touch electrode TE is formed in the above-described mesh type, the opening OA of the touch electrode TE may be positioned on the light emitting area of the subpixel SP. A color filter CF may be disposed on the encapsulation part ENCAP. The color filter CF may be positioned on the touch electrode TE or between the encapsulation part ENCAP and the touch electrode TE.

Figure 10:
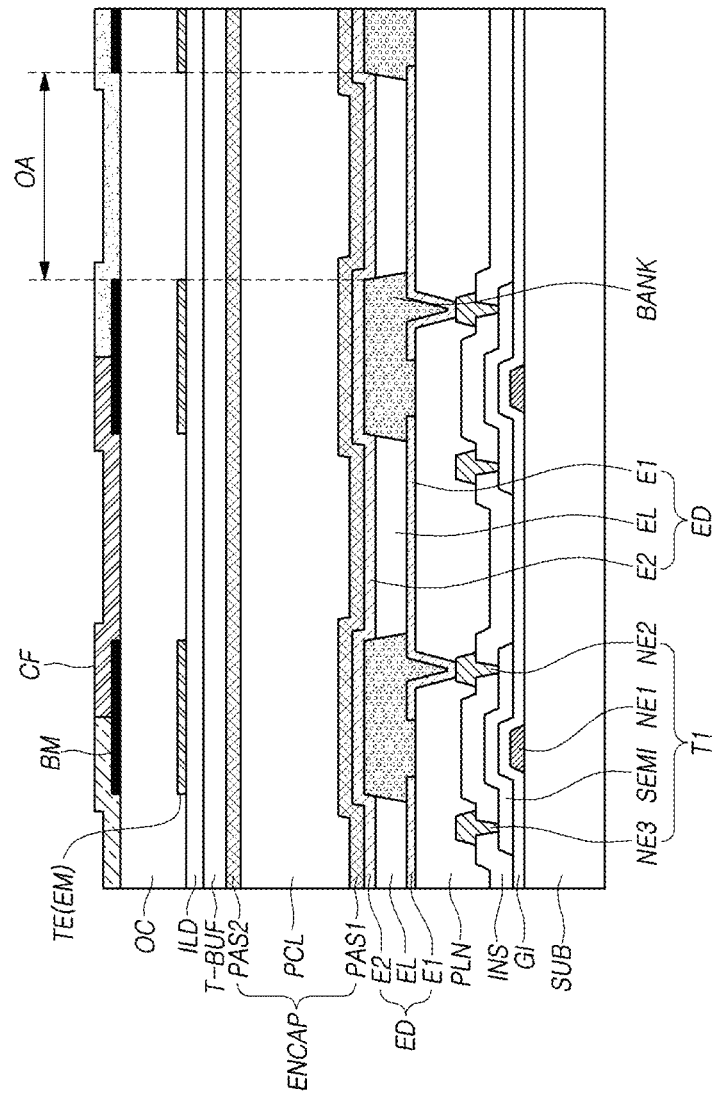
FIGS. 10 and 11 are cross-sectional views illustrating a structure in which a color filter is included in a display panel according to an embodiment.
Figure 11:
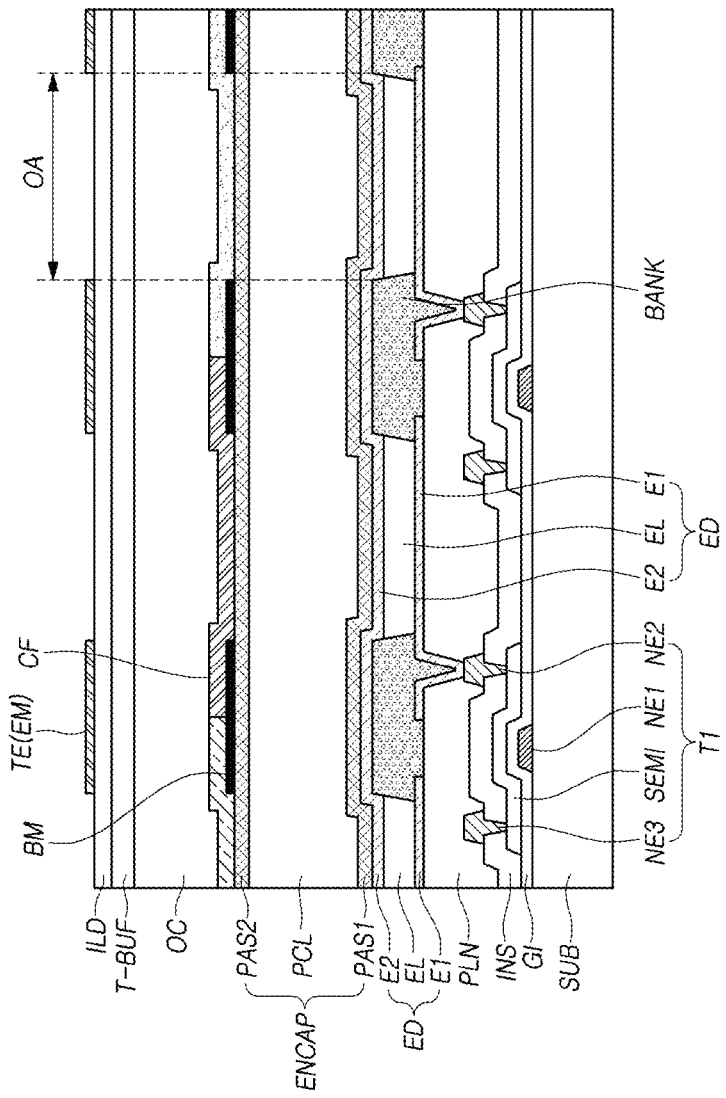

FIGS. 10 and 11 are cross-sectional views illustrating a structure in which a color filter CF is included in a display panel DISP according to an embodiment.

Referring to FIGS. 10 and 11, where the touch panel TSP is embedded in the display panel DISP, and the display panel DISP is implemented as an OLED panel, the touch panel TSP may be positioned on the encapsulation part ENCAP in the display panel DISP. In other words, the touch sensor metal, such as multiple touch routing lines TL or multiple touch electrodes TE, may be positioned on the encapsulation part ENCAP in the display panel DISP.

As described above, as the touch electrode TE is formed on the encapsulation part ENCAP, the touch electrode TE may be formed without significantly affecting the formation of display-related layers and the performance of display.

Referring to FIGS. 10 and 11, the second electrode E2, which may be the cathode electrode of the OLED, may be positioned under the encapsulation part ENCAP.

The thickness T of the encapsulation part ENCAP may be, e.g., 1 μm or more.

As described above, as the thickness of the encapsulation part ENCAP is designed to be 1 μm or more, the parasitic capacitance formed between the touch electrodes TE and the second electrode E2 of the OLED may be reduced. Thus, deterioration of touch sensitivity due to parasitic capacitance may be prevented.

As set forth above, each of the plurality of touch electrodes TE may have the electrode metal EM patterned in a mesh type with two or more openings OA, and each of the two or more openings OA may correspond to one or more subpixels or its light emission area as viewed in the vertical direction.

As described above, the electrode metal EM may be patterned so that the light emitting area of one or more subpixels is present corresponding to the position of each of two or more openings OA present in the area of the touch electrode TE as viewed at plan view. Thus, the light emitting efficiency of the display panel DISP may be increased.

As shown in FIGS. 10 and 11, a black matrix BM may be disposed on the display panel DISP, and a color filter CF may further be disposed.

The position of the black matrix BM may correspond to the position of the electrode metal EM of the touch electrode TE.

The position of multiple color filters CF corresponds to the position of multiple touch electrodes TE or the electrode metal EM constituting multiple touch electrodes TE.

As described above, as multiple color filters CF are placed in the position corresponding to the position of multiple openings OA, the light emitting performance of the display panel DISP may be increased.

The vertical position relationship between multiple color filters CF and multiple touch electrodes TE is described below.

As shown in FIG. 10, multiple color filters CF and a black matrix BM may be positioned on multiple touch electrodes TE.

In this case, the multiple color filters CF and the black matrix BM may be positioned on an overcoat layer OC disposed on the multiple touch electrodes TE. The overcoat layer OC may be a layer which is identical to or different from the touch protection film PAC of FIG. 9.

As shown in FIG. 11, the multiple color filters CF and the black matrix BM may be positioned under the multiple touch electrodes TE.

In this case, the multiple touch electrodes TE may be positioned over the overcoat layer OC on the multiple color filters CF and the black matrix BM. The overcoat layer OC may be a layer which is identical to or different from the touch buffer film T-BUF or touch insulation film ILD of FIG. 9. Alternatively, the touch buffer film T-BUF or touch insulation film ILD may be disposed separately from the overcoat layer OC.

As such, it is possible to place the configuration for touch sensing without deteriorating display performance by adjusting the vertical position relationship between the touch electrode TE and the configuration for display driving.

As the touch electrodes TE and lines are placed on the electrodes and lines for display driving, the configuration for display driving may influence the touch sensing performance.

According to embodiments of the disclosure, there is provided a touch display device capable of enhancing the performance of touch sensing while minimizing the influence that the configuration for display driving has on touch sensing by the connection structure of the touch routing line TL connected with the touch electrode TE.

Figure 12:
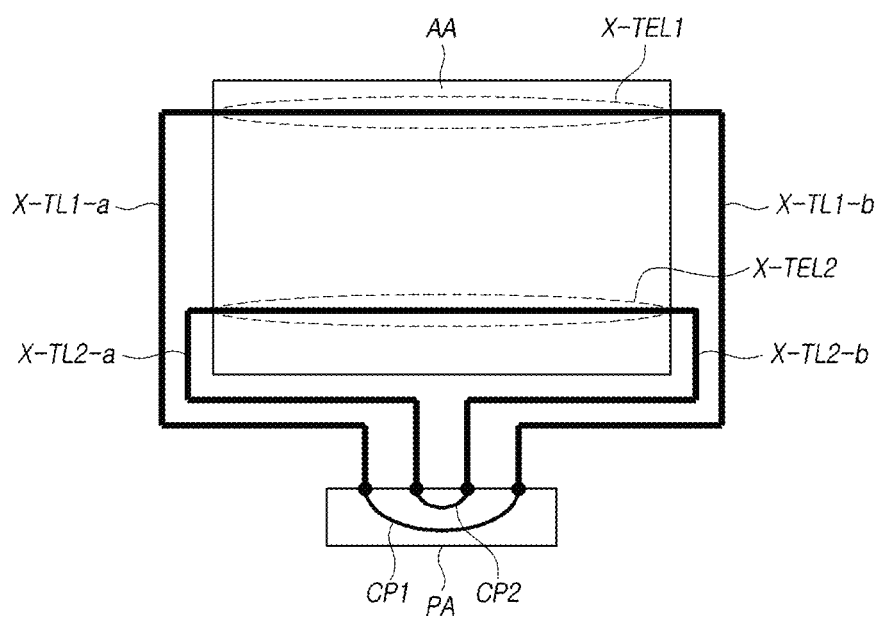
FIG. 12 is a view illustrating an example structure in which a touch electrode line and a touch routing line are disposed in a touch display device according to an embodiment.

FIG. 12 is a view illustrating an example structure in which a touch electrode line TEL and a touch routing line TL are disposed in a touch display device according to an embodiment.

Referring to FIG. 12, a plurality of touch electrode lines TEL may be disposed in the active area AA of the display panel DISP. A plurality of touch routing lines TL which are electrically connected with the touch electrode lines TEL.

The touch routing lines TL connected with the touch electrode lines TEL may be disposed on both sides of the active area AA.

As an example, a first X-touch routing line X-TL1 electrically connected with a first X-touch electrode line X-TEL1 may include a first line X-TL1-*a* connected to one side of the first X-touch electrode line X-TEL1 and a second line X-TL1-*b* connected to the other side of the first X-touch electrode line X-TEL1.

The first line X-TL1-*a* and the second line X-TL1-*b* of the first X-touch routing line X-TL1 may be electrically connected with each other in an area other than the active area AA. The first line X-TL1-*a* and the second line X-TL1-*b* may be electrically connected with each other by a first connection pattern CP1 in a pad area PA as shown in FIG. 12. Or, they may be connected together on a printed circuit connected with the display panel DISP.

Further, a second X-touch routing line X-TL2 electrically connected with a second X-touch electrode line X-TEL2 may include a first line X-TL2-*a* connected to one side of the second X-touch electrode line X-TEL2 and a second line X-TL2-*b* connected to the other side of the second X-touch electrode line X-TEL2.

The first line X-TL2-*a* and the second line X-TL2-*b* of the second X-touch routing line X-TL2 may be electrically connected with each other by a second connection pattern CP2 in the pad area PA.

As the touch routing lines TL are connected to both sides of the touch electrode lines TEL disposed in the active area AA so that the touch driving signal is supplied or the touch sensing signal is detected, loads may be reduced as compared with when one touch routing line TL is used to drive the touch electrode lines TEL.

Further, as the touch routing lines TL connected with the same touch electrode line TEL are electrically connected with each other in the pad area PA or on the printed circuit, loads may be reduced while performing touch sensing, without the need for adding a channel.

Figure 13:
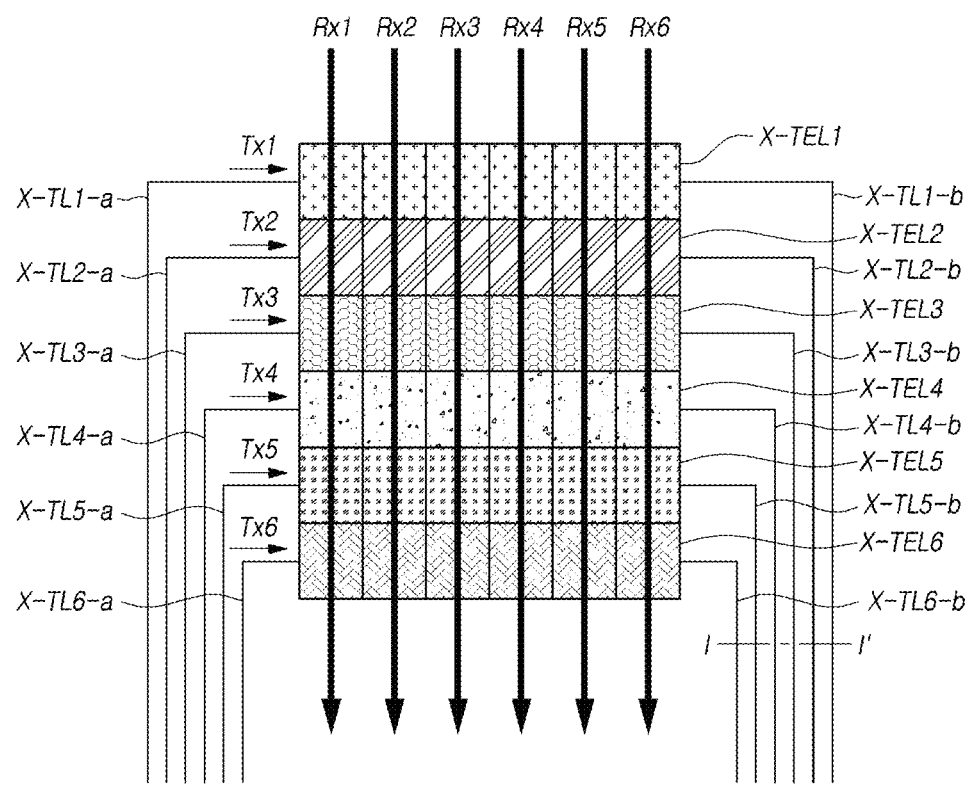
FIG. 13 is a view illustrating an example driving scheme for a touch display device as shown in FIG. 12.
Figure 14:
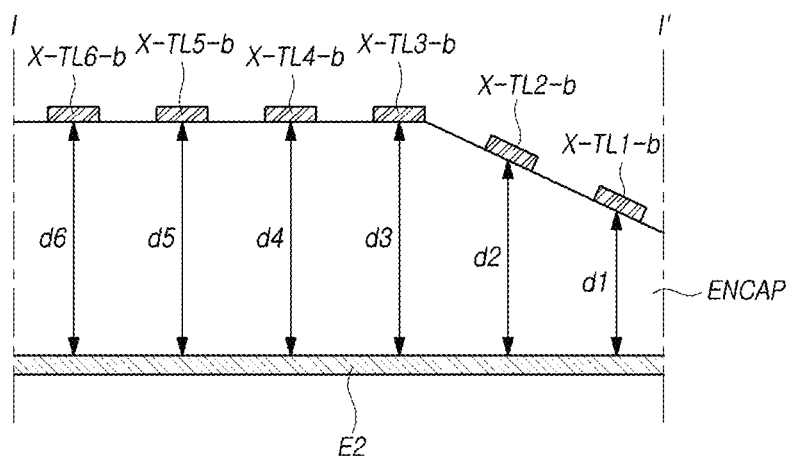
FIG. 14 is a cross-sectional view illustrating an example structure, taken along line I-I' of FIG. 13.

FIG. 13 is a view illustrating an example driving scheme for a touch display device as shown in FIG. 12. FIG. 14 is a cross-sectional view illustrating an example structure, taken along line I-I' of FIG. 13.

FIG. 13 illustrates an example in which one X-touch electrode line X-TEL includes six sensing nodes, and the touch driving signal is supplied to the X-touch electrode line X-TEL for ease of description. Sensing node may mean a point where the X-touch electrode line X-TEL and the Y-touch electrode line Y-TEL cross each other.

Although no Y-touch electrode line Y-TEL is shown, the touch electrode TE included in the X-touch electrode line X-TEL and the Y-touch electrode line Y-TEL may be shaped as a rhombus as shown in FIG. 8. Although the X-touch electrode line is primarily described, embodiments of the disclosure may apply likewise to the Y-touch electrode line Y-TEL.

The touch driving signal may be supplied to the plurality of X-touch electrode lines X-TEL. The touch driving signal may sequentially be supplied to the X-touch electrode lines X-TEL, or may be simultaneously supplied to two or three X-touch electrode lines X-TEL.

The X-touch routing line X-TL may be electrically connected to both sides of each X-touch electrode line X-TEL. As an example, the first line X-TL1-*a* and the second line X-TL1-*b* of the first X-touch routing line X-TL1 may be connected to both sides of the first X-touch electrode line X-TEL1.

Thus, the touch driving signal may be supplied to both sides of the first X-touch electrode line X-TEL1 via the first line X-TL1-*a* and second line X-TL1-*b* of the first X-touch routing line X-TL1. Likewise, the touch driving signal may be supplied to both sides of each X-touch electrode line X-TEL other than the first X-touch electrode line X-TEL1.

Where the X-touch electrode line X-TEL is a sensing touch electrode line, the touch sensing signal may be detected via the X-touch routing line X-TL connected to both sides of the X-touch electrode line X-TEL.

As the touch driving signal is supplied or the touch sensing signal is detected via the X-touch routing line X-TL connected to both sides of the X-touch electrode line X-TEL, loads of touch driving or sensing may be reduced.

At this time, the length of the X-touch routing line X-TL connected to the X-touch electrode line X-TEL may be varied depending on the position of the X-touch electrode line X-TEL. As an example, the length of the first X-touch routing line X-TL1 connected to the first X-touch electrode line X-TEL1 may be largest, and the length of the sixth X-touch routing line X-TL6 connected to the sixth X-touch electrode line X-TEL6 may be smallest.

Thus, the difference in load between the X-touch routing lines X-TL may occur. In other words, a difference in parasitic capacitance may occur between the X-touch routing line X-TL and the display driving electrode or line disposed thereunder, depending on the length of the X-touch routing line X-TL.

In particular, a portion of the X-touch routing line X-TL may be disposed in an inclined area of the encapsulation part ENCAP, and the inclined area of the encapsulation part ENCAP is thin so that the parasitic capacitance between the X-touch routing line X-TL and the display driving electrode may increase.

FIG. 14 illustrates an example cross-sectional structure in which the X-touch routing line X-TL of FIG. 13 is disposed on the encapsulation part ENCAP.

Among the X-touch routing lines X-TL, some X-touch routing lines X-TL3-b, X-TL4-b, X-TL5-b, and X-TL6-b may be arranged in the planarized area of the encapsulation part ENCAP. The remaining X-touch routing lines X-TL1-b and X-TL2-b may be disposed in the non-planarized area of the encapsulation part ENCAP.

The second electrode E2 of the light emitting element ED may be disposed under the encapsulation part ENCAP. Or, signal lines for display driving may be disposed.

An example in which the second electrode E2 is disposed under the encapsulation part ENCAP is described. Since the encapsulation part ENCAP has different thicknesses in the planarized area and non-planarized area of the encapsulation part ENCAP, different distances may occur between the X-touch routing lines X-TL and the second electrode E2 positioned under the encapsulation part ENCAP.

As shown in FIG. 14, the distances d1 and d2 between the X-touch routing lines X-TL1-b and X-TL2-b and the second electrode E2 may be smaller than the distances d3, d4, d5, and d6 between the X-touch routing lines X-TL3-b, X-TL4-b, X-TL5-b, and X-TL6-b and the second electrode E2.

As the distances between relatively longer X-touch routing lines X-TL1-b and X-TL2-b and the second electrode E2 are smaller, the difference in parasitic capacitance with the X-touch routing line X-TL may increase.

According to an embodiment, there is provided a method for enhancing the performance of touch sensing by minimizing the difference in parasitic capacitance due to the difference in length between the touch routing lines TL while reducing loads by connecting the touch routing line TL driven by each channel to both sides of the touch electrode line TEL.

Figure 15:
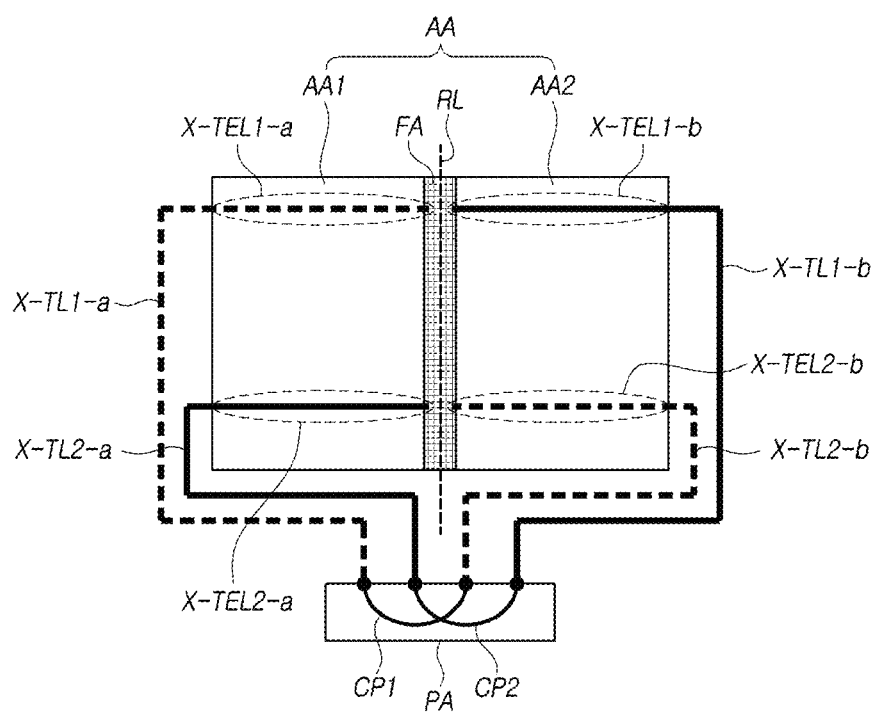
FIG. 15 is a view illustrating an example structure in which a touch electrode line and a touch routing line are disposed in a touch display device according to an embodiment.

FIG. 15 is a view illustrating an example structure in which a touch electrode line TEL and a touch routing line TL are disposed in a touch display device according to an embodiment.

Referring to FIG. 15, the active area AA of the display panel DISP may be divided into a first active area AA1 and a second active area AA2 with respect to a reference line RL.

The area between the first active area AA1 and the second active area AA2 may overlap the folding area FA, but not limited thereto. In other words, the area between the first active area AA1 and the second active area AA2 may be the folding area FA or may be an area which is not foldable.

The first active area AA1 and the second active area AA2 may be separated with respect to the reference line RL or may be separated by the arrangement structure of the touch electrode lines TEL disposed in the active area AA.

The touch electrode lines TEL arranged in the active area AA may be disposed in the first active area AA1 and the second active area AA2 in a separated structure.

As an example, the first X-touch electrode line X-TEL1 may include a first portion X-TEL1-a disposed in the first active area AA1 and a second portion X-TEL1-b disposed in the second active area AA2. The first portion X-TEL1-a and second portion X-TEL1-b of the first X-touch electrode line X-TEL1 may be disposed on the same line and be disposed in a separated structure.

The second touch electrode line X-TEL2 disposed on a different line from the first X-touch electrode line X-TEL1 may include a first portion X-TEL2-a disposed in the first active area AA1 and a second portion X-TEL2-b disposed in the second active area AA2.

The first portion X-TEL1-a of the first X-touch electrode line X-TEL1 may be electrically connected with the first line X-TL1-a of the first X-touch routing line X-TL1. The second portion X-TEL1-b of the first X-touch electrode line X-TEL1 may be electrically connected with the second line X-TL1-b of the first X-touch routing line X-TL1.

The first portion X-TEL2-a of the second X-touch electrode line X-TEL2 may be electrically connected with the first line X-TL2-a of the second X-touch routing line X-TL2, and the second portion X-TEL2-b of the second X-touch electrode line X-TEL2 may be electrically connected with the second line X-TL2-b of the second X-touch routing line X-TL2.

The first line X-TL1-a of the first X-touch routing line X-TL1 may be electrically connected with the second line X-TL2-b of the second X-touch routing line X-TL2 in an area other than the active area AA.

As an example, the first line X-TL1-a of the first X-touch routing line X-TL1 and the second line X-TL2-b of the second X-touch routing line X-TL2 may be electrically connected with each other by a first connection pattern CP1 in the pad area PA. Or, they may be electrically connected with each other on the printed circuit connected to the display panel DISP.

The first connection pattern CP1 disposed in the pad area PA may be a metal disposed on a different layer from the first X-touch routing line X-TL1 and the second X-touch routing line X-TL2.

The second line X-TL1-b of the first X-touch routing line X-TL1 may be electrically connected with the first line X-TL2-a of the second X-touch routing line X-TL2 in an area other than the active area AA.

The second line X-TL1-b of the first X-touch routing line X-TL1 and the first line X-TL2-a of the second X-touch routing line X-TL2 may be electrically connected with each other in the pad area PA or on the printed circuit connected to the display panel DISP and, as an example, may be electrically connected with each other by a second connection pattern CP2.

Thus, the first line X-TL1-a of the first X-touch routing line X-TL1 and the second line X-TL2-b of the second X-touch routing line X-TL2 may be driven by the same channel. The second line X-TL1-b of the first X-touch routing line X-TL1 and the first line X-TL2-a of the second X-touch routing line X-TL2 may be driven by the same channel.

At this time, the first line X-TL1-a of the first X-touch routing line X-TL1, which is relatively long, is electrically connected with the second line X-TL2-b of the second X-touch routing line X-TL2, which is relatively short. Further, the second line X-TL1-b of the first X-touch routing line X-TL1, which is relatively long, is electrically connected with the first line X-TL2-*a* of the second X-touch routing line X-TL2, which is relatively short.

Hence, the overall length of the touch routing line TL driven by each channel may have a constant value or fall within a predetermined range.

Further, since the difference in length of the touch routing line TL driven by each channel reduces, the difference in parasitic capacitance depending on the length of the touch routing line TL may be reduced.

In some cases, the difference in parasitic capacitance depending on the arrangement position and length of touch routing line TL may be compensated by connecting the longer touch routing line TL disposed in the non-planarized area of the encapsulation part ENCAP with the shorter touch routing line TL disposed in the planarized area of the encapsulation part ENCAP.

Therefore, it is possible to reduce loads and differences in parasitic capacitance using the double routing structure in which the touch routing line TL is connected to both sides of the touch electrode line TEL. Thus, the performance of touch sensing may be enhanced.

The touch electrode line TEL disposed in a separated structure may be the touch electrode line TEL disposed in parallel with the longer edge of the outer border of the active area AA. In other words, the touch electrode line TEL which is more loaded may be disposed in a separated structure, but embodiments of the disclosure are not limited thereto.

The touch electrode line disposed in the separated structure may be a driving touch electrode line or sensing touch electrode line.

In some cases, the X-touch electrode line X-TEL and the Y-touch electrode line Y-TEL both may be disposed in the separated structure, and the Y-touch routing line Y-TL may be connected in a similar manner to the connection structure of the X-touch routing line X-TL. In other words, the driving touch electrode line and the sensing touch electrode line each may be separated in the active area AA and be driven in the double routing structure. As the touch routing line TL connected to the portions of the touch electrode line TEL disposed on different lines is shorted in an area other than the active area AA, it is possible to reduce the difference in parasitic capacitance due to the difference in length between the touch routing lines TL.

Figure 16:
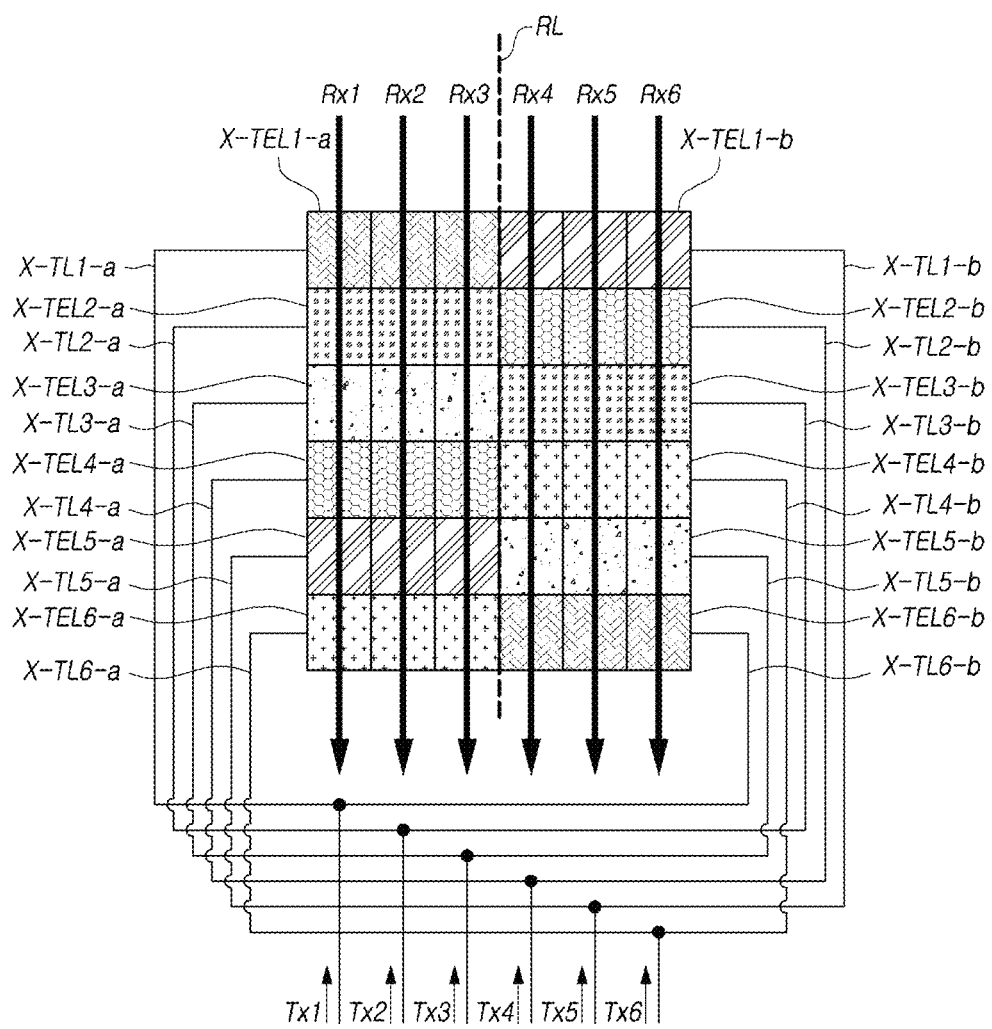
FIGS. 16, 17, and 18 are views illustrating an example driving scheme and an example touch routing line connection structure in a touch display device as shown in FIG. 15.
Figure 17:
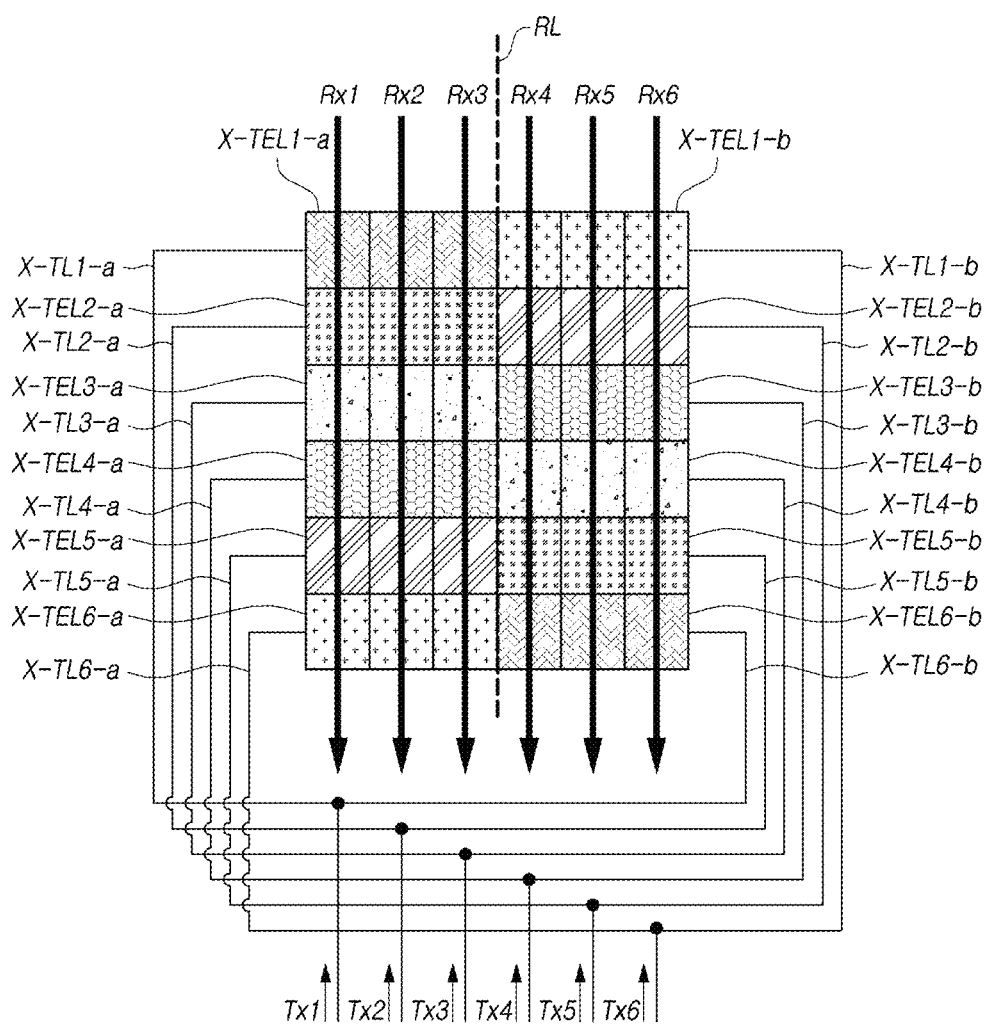
Figure 18:
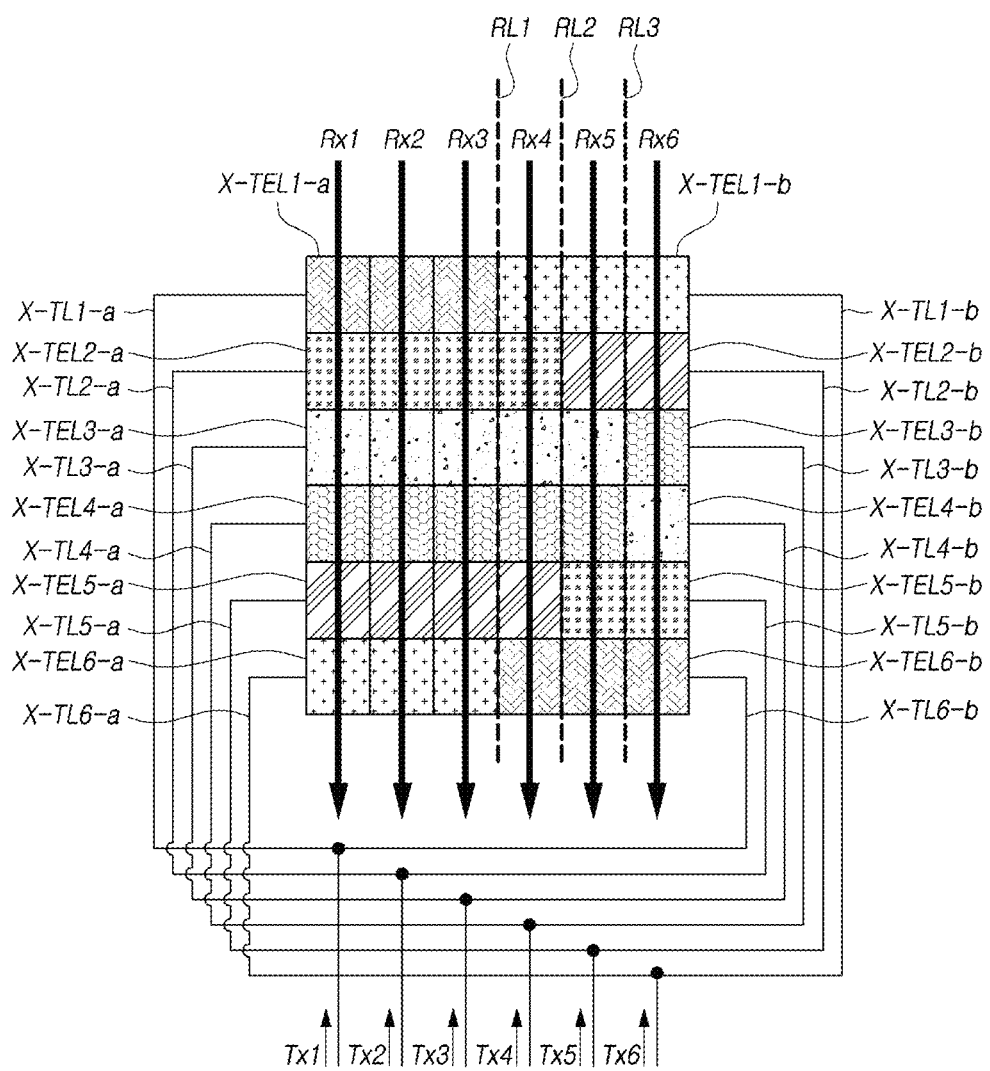

FIGS. 16, 17, and 18 are views illustrating an example driving scheme and an example touch routing line TL connection structure in a touch display device as shown in FIG. 15.

Referring to FIG. 16, each X-touch electrode line X-TEL may be disposed in a separated structure with respect to a reference line RL. For the X-touch routing lines X-TL connected to both sides of each X-touch electrode line X-TEL, X-touch routing lines X-TL connected to the X-touch electrode lines X-TEL disposed on different lines may be electrically connected with each other.

For example, the first line X-TL1-*a* of the first X-touch routing line X-TL1 connected to the first portion X-TEL1-*a* of the first X-touch electrode line X-TEL1 may be electrically connected with the second line X-TL6-*b* of the sixth X-touch routing line X-TL6 connected to the second portion X-TEL6-*b* of the sixth X-touch electrode line X-TEL6.

The first line X-TL2-*a* of the second X-touch routing line X-TL2 connected to the first portion X-TEL2-*a* of the second X-touch electrode line X-TEL2 may be electrically connected with the second line X-TL3-*b* of the third X-touch routing line X-TL3 connected to the second portion X-TEL3-*b* of the third X-touch electrode line X-TEL3.

The first line X-TLi-a of the ith X-touch routing line X-TLi connected to the first portion X-TELi-a of the ith X-touch electrode line X-TELi may be electrically connected with the second line X-TLj-b of the jth X-touch routing line X-TLj connected to the second portion X-TELj-b of the jth X-touch electrode line X-TELj (where j differs from i).

That is, the first line X-TLi-a of the ith X-touch routing line X-TLi and the second line X-TLj-b of the jth X-touch routing line X-TLj may be driven by the same channel.

Thus, where the X-touch electrode line X-TEL is the driving touch electrode line, the touch driving signal may be simultaneously supplied to the first portion X-TELi-a of the ith X-touch electrode line X-TELi and the second portion X-TELj-b of the jth X-touch electrode line X-TELj.

At this time, the X-touch routing lines X-TL may be sequentially driven, or two or three X-touch routing lines X-TL may be simultaneously driven. Detection of the touch sensing signal via the Y-touch electrode lines Y-TEL may be simultaneously performed.

It is possible to reduce the overall length of the X-touch routing lines X-TL electrically connected, by mutually connecting the first line X-TLi-a of the ith X-touch routing line X-TLi and the second line X-TLj-b of the jth X-touch routing line X-TLj.

That is, the overall length of the X-touch routing lines X-TL electrically connected may be smaller than the sum of the lengths of the first line X-TL1-*a* and the second line X-TL1-*b* of the longest first X-touch routing line X-TL1. The overall length of the X-touch routing lines X-TL electrically connected may be larger than the sum of the lengths of the first line X-TL6-*a* and the second line X-TL6-*b* of the shortest sixth X-touch routing line X-TL6.

Thus, in the structure in which the X-touch routing line X-TL is connected to both sides of the X-touch electrode line X-TEL, it is possible to reduce the difference in parasitic capacitance due to the difference in length between the X-touch routing lines X-TL.

It is possible to minimize the difference in length between the X-touch routing lines X-TL by symmetrically placing the X-touch routing lines X-TL electrically connected.

Referring to FIG. 17, each X-touch electrode line X-TEL may be separated into a first portion X-TEL-a and a second portion X-TEL-b with respect to a reference line RL.

The first line X-TL1-*a* of the first X-touch routing line X-TL1 connected to the first portion X-TEL1-*a* of the first X-touch electrode line X-TEL1 may be electrically connected with the second line X-TL6-*b* of the sixth X-touch routing line X-TL6 connected to the second portion X-TEL6-*b* of the sixth X-touch electrode line X-TEL6, in an area other than the active area AA.

The first line X-TL6-*a* of the sixth X-touch routing line X-TL6 connected to the first portion X-TEL6-*a* of the sixth X-touch electrode line X-TEL6 may be electrically connected with the second line X-TL1-*b* of the first X-touch routing line X-TL1 connected to the second portion X-TEL1-*b* of the first X-touch electrode line X-TEL1.

That is, the first line X-TLi-a of the ith X-touch routing line X-TLi connected to the first portion X-TELi-a of the ith X-touch electrode line X-TELi may be electrically connected with the second line X-TLj-b of the jth X-touch routing line X-TLj connected to the second portion X-TELj-b of the jth X-touch electrode line X-TELj. The first line X-TLj-a of the jth X-touch routing line X-TLj connected to the first portion X-TELj-a of the jth X-touch electrode line X-TELj may be electrically connected with the second line X-TLi-b of the ith X-touch routing line X-TLi connected to the second portion X-TELi-b of the ith X-touch electrode line X-TELi.

In some cases, in the case of the X-touch routing line X-TL connected to the X-touch electrode line X-TEL disposed in the middle of the active area AA, the first line X-TL-a and second line X-TL-b of the X-touch routing line X-TL connected to the first portion X-TEL-a and second portion X-TEL-b, respectively, of the X-touch electrode line X-TEL disposed on the same line may be electrically connected with each other.

The sum of the lengths of the first line X-TL-a and the second line X-TL-b of the X-touch routing line X-TL electrically connected with each other may have a value identical to, or very close to, a constant value.

That is, it is possible to mutually connect the first line X-TL-a and the second line X-TL-b symmetrically disposed to minimize the overall difference in length of the X-touch routing line X-TL.

Thus, since the difference in length of the X-touch routing line X-TL driven by each channel is minimized, the difference in parasitic capacitance between the display driving electrode and the X-touch routing line X-TL may be reduced, thus enhancing the performance of touch sensing and reducing the loads by double routing driving.

As the touch electrode line TEL is disposed in a separated structure in the active area AA, the touch electrodes TE positioned in the separated portions of the touch electrode line TEL may differ in size or shape from other touch electrodes TE.

As an example, where the touch electrode TE is shaped as a rhombus, the touch electrodes TE disposed in the separated portions of the touch electrode line TEL in the active area AA may have a half-rhombus shape. Thus, touch sensing sensitivity may be varied where the touch electrode line TEL is separated.

According to an embodiment, it is possible to prevent uneven touch sensing sensitivity due to separation of the touch electrode line TEL in the active area AA by arranging them so that no separated portions of the touch electrode lines TEL are not aligned.

Referring to FIG. 18, each touch electrode line X-TEL disposed in the active area AA may be disposed in a separated structure.

For example, the first X-touch electrode line X-TEL1 may be separated into a first portion X-TEL1-a and a second portion X-TEL1-b with respect to a first reference line RL1. The sixth X-touch electrode line X-TEL6 may be separated into a first portion X-TEL6-a and a second portion X-TEL6-b with respect to the first reference line RL1.

The first line X-TL1-a of the first X-touch routing line X-TL1 may be electrically connected with the second line X-TL6-b of the sixth X-touch routing line X-TL6, and the second line X-TL1-b of the first X-touch routing line X-TL1 may be electrically connected with the first line X-TL6-a of the sixth X-touch routing line X-TL6.

Thus, the X-touch electrode line X-TEL and X-touch routing line X-TL driven by each channel may have an overall similar length.

At least some of the X-touch electrode lines X-TEL other than the first X-touch electrode line X-TEL1 and the sixth X-touch electrode line X-TEL6 may be separated with reference to other reference lines RL than the first reference line RL1.

As an example, the second X-touch electrode line X-TEL2 and the fifth X-touch electrode line X-TEL5 each may be separated with reference to a second reference line RL2. The third X-touch electrode line X-TEL3 and the fourth X-touch electrode line X-TEL4 each may be separated with reference to a third reference line RL3.

Also in such a case, the first line X-TL2-a and second line X-TL2-b of the second X-touch routing line X-TL2 may be electrically connected with the second line X-TL5-b and first line X-TL5-a, respectively, of the fifth X-touch routing line X-TL5. The first line X-TL3-a and second line X-TL3-b of the third X-touch routing line X-TL3 may be electrically connected with the second line X-TL4-b and first line X-TL4-a, respectively, of the fourth X-touch routing line X-TL4.

Thus, the difference in length of the X-touch routing line X-TL driven by each channel may be minimized.

As at least some of the plurality of X-touch electrode lines X-TEL are separated with respect to different reference lines RL, the separated portions of the X-touch electrode lines X-TEL may be distributed in the active area AA.

That is, the separated portions of the first X-touch electrode line X-TEL1 and the sixth X-touch electrode line X-TEL6 may be positioned on the first reference line RL1. The separated portions of the second X-touch electrode line X-TEL2 and the fifth X-touch electrode line X-TEL5 may be positioned on the second reference line RL2. The separated portions of the third X-touch electrode line X-TEL3 and the fourth X-touch electrode line X-TEL4 may be positioned on the third reference line RL3.

Thus, the separated portions of the X-touch electrode line X-TEL may be positioned on at least two or more straight lines.

As the separated portions of the X-touch electrode line X-TEL are positioned on two or more straight lines in the active area AA, the separated portions of the X-touch electrode line X-TEL may be dispersed, enhancing the uniformity of touch sensing sensitivity.

As such, according to embodiments of the disclosure, in the scheme of driving the touch electrode line TEL in the double routing structure, the difference in length of the touch routing line TL and touch electrode line TEL driven by each channel may be reduced, thus decreasing the difference in touch sensing.

Further, as the separated portions of the touch electrode line TEL are distributed in the active area AA, the uniformity of touch sensing sensitivity may be maintained.

Although in the above-described examples, the separated touch electrode line TEL is a driving touch electrode line, embodiments of the disclosure may also be applied where the separated touch electrode line TEL is a sensing touch electrode line.

Figure 19A:
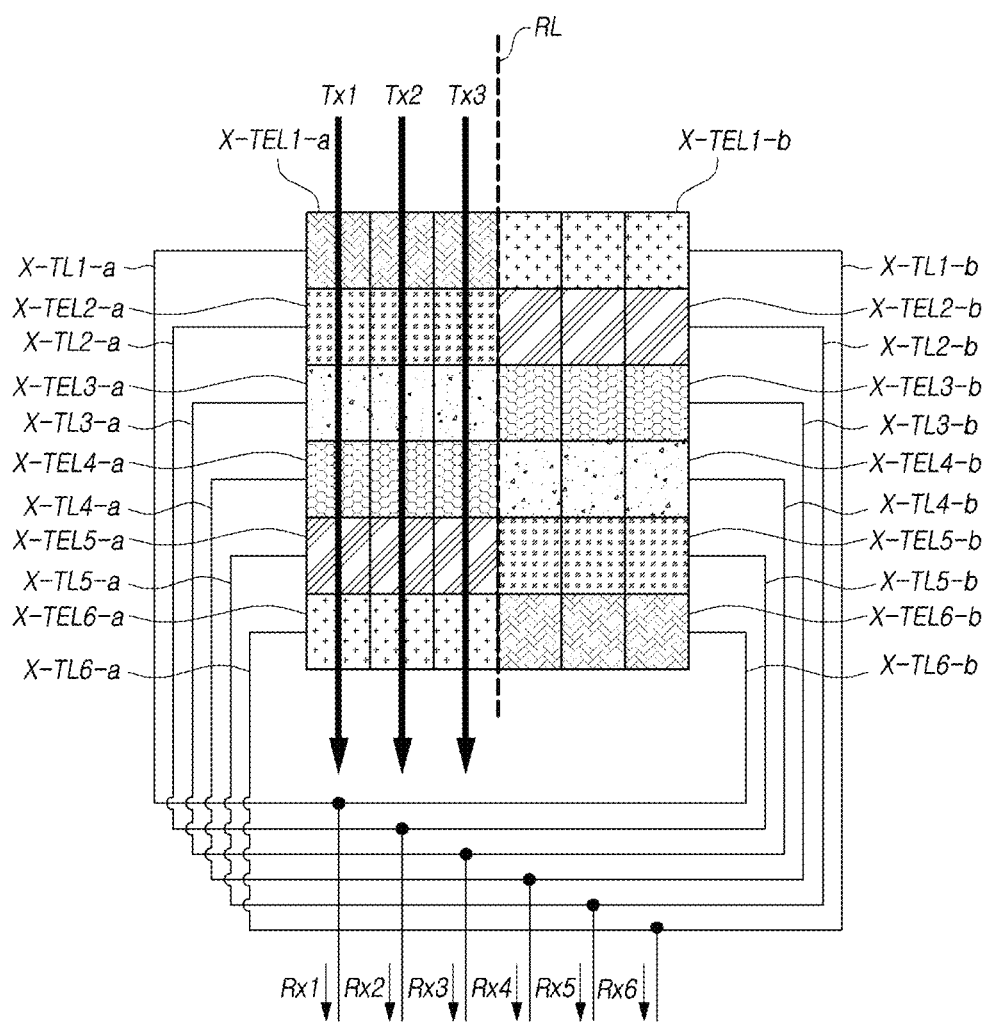
FIGS. 19A, 19B, and 20 are views illustrating an example driving scheme and an example touch routing line connection structure in a touch display device as shown in FIG. 15.
Figure 19B:
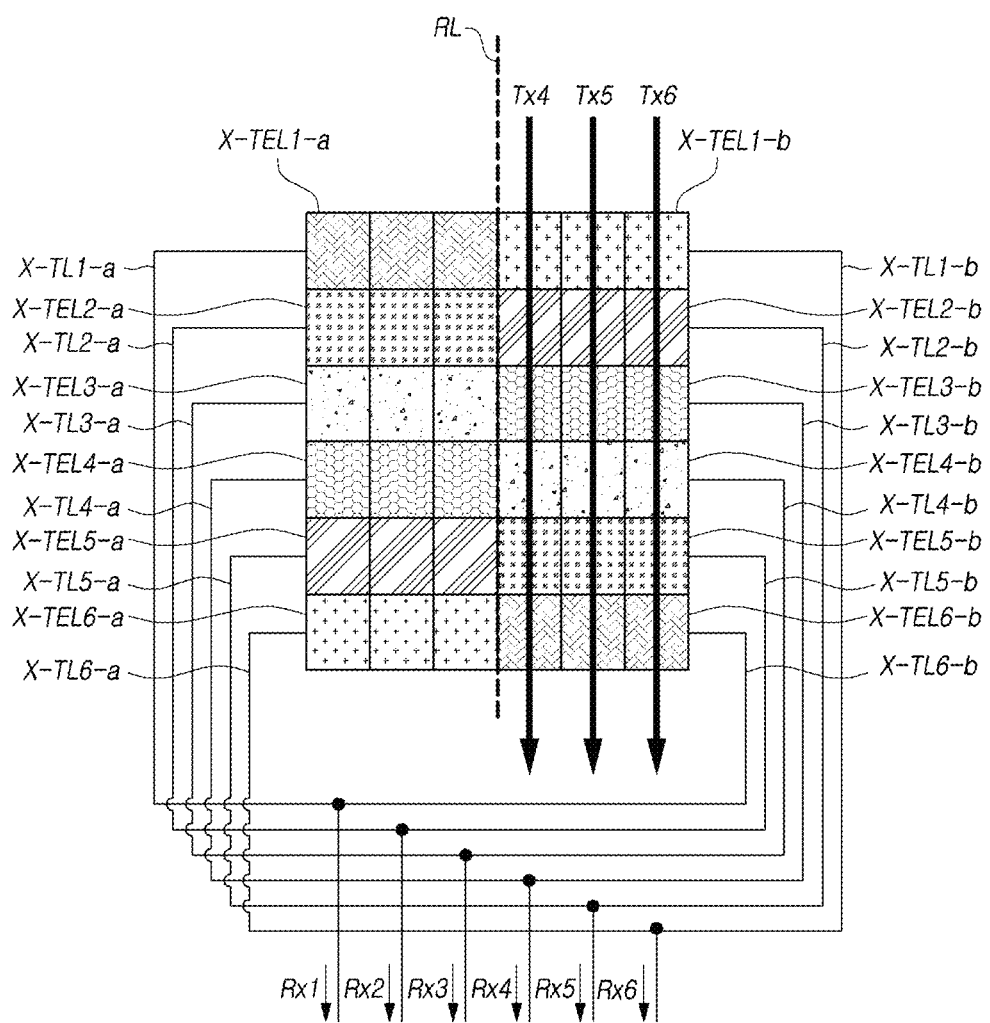
Figure 20:
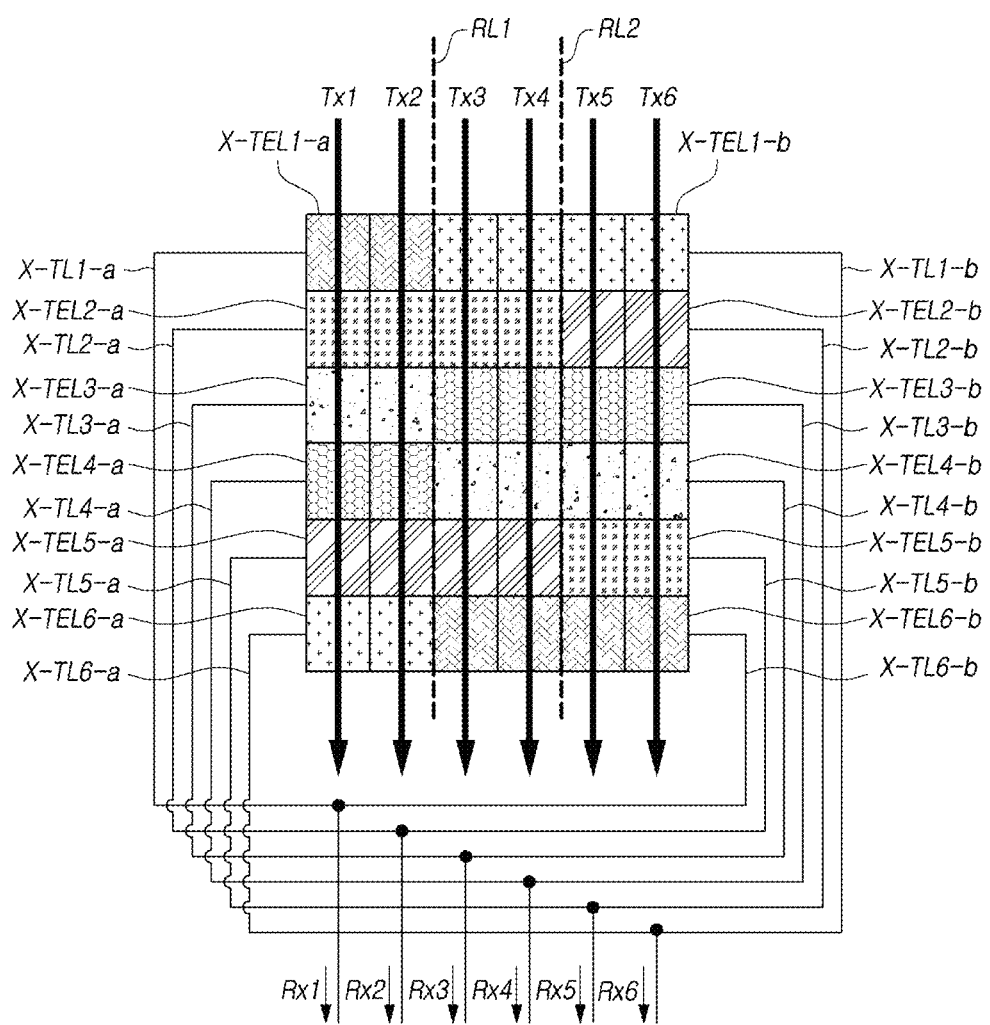

FIGS. 19A, 19B, and 20 are views illustrating an example driving scheme and an example touch routing line (TL) connection structure in a touch display device as shown in FIG. 15. FIGS. 19A and 19B illustrate an example in which multiple X-touch electrode lines X-TEL are separated with respect to one reference line RL, and FIG. 20 illustrates an example in which multiple X-touch electrode lines X-TEL are separated with respect to a plurality of reference lines RL.

Referring to FIGS. 19A and 19B, the X-touch electrode line X-TEL may be separated into a first portion X-TEL-a and a second portion X-TEL-b with respect to a reference line RL. The X-touch routing lines X-TL connected to different X-touch electrode lines X-TEL may be electrically connected with each other so that the difference in length of the X-touch routing line X-TL driven by each channel is minimized.

Since the X-touch electrode line X-TEL disposed in the separated structure is the sensing touch electrode line, the touch driving signal may be supplied to the Y-touch electrode line Y-TEL.

The touch driving signal may sequentially be supplied to the Y-touch electrode lines Y-TEL, or may be simultaneously supplied to a predetermined number of Y-touch electrode lines Y-TEL.

At this time, the period during which the touch driving signal is supplied to the Y-touch electrode line Y-TEL positioned in the area where the first portion X-TEL-a of the X-touch electrode line X-TEL is disposed may differ from the period during which the touch driving signal is supplied to the Y-touch electrode line Y-TEL positioned in the area where the second portion X-TEL-b of the X-touch electrode line X-TEL is disposed.

As an example, referring to FIG. 19A, touch driving signals Tx1, Tx2, and Tx3 may be supplied to the Y-touch electrode line Y-TEL positioned in the area where the first portions X-TEL-a of multiple X-touch electrode lines X-TEL are disposed. Referring to FIG. 19B, touch driving signals Tx4, Tx5, and Tx6 may be supplied to the Y-touch electrode line Y-TEL positioned in the area where the second portions X-TEL-b of multiple X-touch electrode lines X-TEL are disposed, during a period different from the period during which Tx1, Tx2, and Tx3 are supplied.

Thereafter, touch sensing may be performed by simultaneously receiving the touch sensing signals via the X-touch electrode lines X-TEL.

Thus, although the X-touch routing lines X-TL for detecting the touch sensing signals are connected to the X-touch electrode lines X-TEL disposed on different lines, a touch may be detected using the touch sensing signal received by each channel by making the periods, during which touch driving signals are supplied to detect the touch sensing signals from different lines, different from each other.

As an example, for the first portion X-TEL1-a of the first X-touch electrode line X-TEL1 and the second portion X-TEL6-b of the sixth X-touch electrode line X-TEL6, touch sensing signals are detected by the same channel.

Upon receiving touch sensing signals, the points where touches occur may be differentiated by making the period during which touch driving signals Tx1, Tx2, and Tx3 are supplied to the Y-touch electrode line Y-TEL positioned on the first portion X-TEL1-a of the first X-touch electrode line X-TEL1 different from the period during which touch driving signals Tx4, Tx5, and Tx6 are supplied to the Y-touch electrode line Y-TEL positioned on the second portion X-TEL6-b of the sixth X-touch electrode line X-TEL6.

Even when the separated portions of the sensing touch electrode lines are distributed on a plurality of reference lines RL, touch sensing may be performed by controlling the driving timing of the driving touch electrode lines.

Referring to FIG. 20, as an example, the first X-touch electrode line X-TEL1, the third X-touch electrode line X-TEL3, the fourth X-touch electrode line X-TEL4, and the sixth X-touch electrode line X-TEL6 may be disposed in a structure in which each is separated with respect to the first reference line RL1. The second X-touch electrode line X-TEL2 and the fifth X-touch electrode line X-TEL5 may be disposed in a structure in which each is separated with respect to the second reference line RL2.

Where the touch driving signal is sequentially supplied to each of the Y-touch electrode lines Y-TEL which are the driving touch electrode lines, the touch driving signals are not simultaneously supplied to the areas where the separated portions of the X-touch electrode lines X-TEL are disposed, so that touch sensing may be performed.

Where touch driving signals are simultaneously supplied to two Y-touch electrode lines Y-TEL, it is possible to stop touch driving signals from being simultaneously supplied to the separated portions of the X-touch electrode lines X-TEL.

As an example, touch driving signals Tx1 and Tx2 may be simultaneously supplied. In a period different from the period during which Tx1 and Tx2 are supplied, touch driving signals Tx3 and Tx4 may be supplied. Thereafter, touch driving signals Tx5 and Tx6 may be supplied.

Thus, since the touch driving signals Tx2 and Tx3 are not simultaneously supplied, the touch driving signals may not simultaneously be supplied to the driving touch electrode lines positioned in the area where the first portion X-TEL-a and second portion X-TEL-b of the X-touch electrode line X-TEL, separated with respect to the first reference line RL1, are disposed.

Further, since the touch driving signals Tx4 and Tx5 are not simultaneously supplied, the touch driving signals may not simultaneously be supplied to the driving touch electrode lines positioned in the area where the first portion X-TEL-a and second portion X-TEL-b of the X-touch electrode line X-TEL, separated with respect to the second reference line RL2, are disposed.

Thus, the position of a touch may be detected based on the touch sensing signal received via the X-touch routing line X-TL connected to the first portion X-TEL-a and second portion X-TEL-b of the X-touch electrode line X-TEL, which are disposed on different lines.

Figure 21:
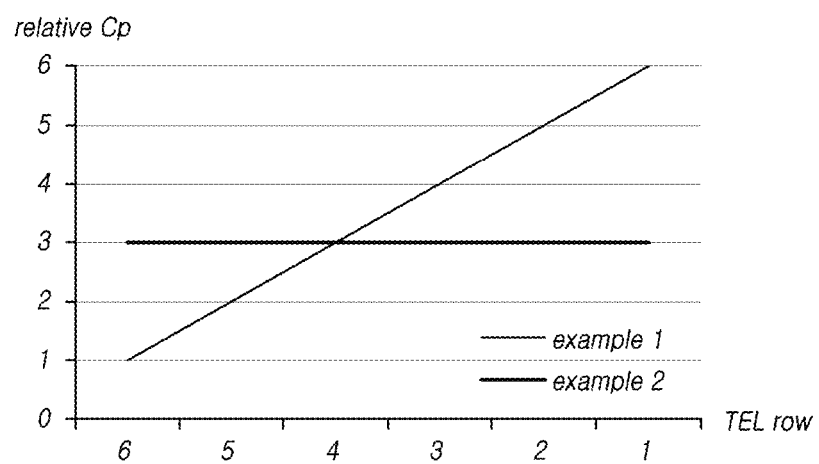
FIG. 21 is a view illustrating the effect of enhancing differences in parasitic capacitance by a touch display device according to an embodiment.

FIG. 21 is a view illustrating the effect of enhancing differences in parasitic capacitance by a touch display device according to an embodiment.

Referring to FIG. 21, example 1 shows relative parasitic capacitance values according to X-touch electrode lines X-TEL in the X-touch routing line (X-TL) connection structure of FIG. 13, and example 2 shows relative parasitic capacitance values according to X-touch electrode lines X-TEL in the X-touch routing line (X-TL) connection structure of FIG. 17.

In example 1, it may be identified that the parasitic capacitance is the largest at the longest first X-touch routing line X-TL1 connected to the first X-touch electrode line X-TEL1 and the smallest at the shortest sixth X-touch routing line X-TL6.

In contrast, it may be identified from example 2 that the parasitic capacitances at the X-touch routing lines X-TL connected to the X-touch electrode lines X-TEL are constant by reducing the difference in the sum of lengths of the X-touch routing lines X-TL.

As set forth above, according to embodiments of the disclosure, as the touch routing line TL is separated in the active area AA, and the touch routing lines TL connected to the portions of the touch electrode line TEL disposed on different lines are connected to each other in an area other than the active area AA, the difference in parasitic capacitance due to the difference in length between the touch routing lines TL may be reduced.

Thus, loads may be reduced, and deterioration of touch sensing performance due to differences in parasitic capacitance may be prevented by driving the touch electrode lines TEL in the double routing structure.

Further, as the separated portions of the touch electrode lines TEL are distributed on a plurality of reference lines RL, it is possible to enhance the performance of touch sensing while preventing deterioration of touch sensing sensitivity at the separated portions of the touch electrode line TEL.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A touch display device, comprising:
    a plurality of light emitting elements arranged in an active area;
    an encapsulation part disposed on the light emitting elements in the active area, a portion of the encapsulation part being disposed in a non-active area positioned outside the active area;
    a plurality of touch electrode lines arranged in the active area on the encapsulation part; and
    a plurality of touch routing lines arranged in the non-active area on the encapsulation part and electrically connected with the touch electrode lines, wherein
    the plurality of touch electrode lines include
    a plurality of X-touch electrode lines arranged in a first direction and a plurality of Y-touch electrode lines arranged in a second direction crossing the first direction, wherein
    at least one touch electrode line among the X-touch electrode lines and the Y-touch electrode lines includes a first portion and a second portion separated from the first portion and disposed on a line where the first portion is disposed, wherein
    the plurality of touch routing lines include
    a plurality of first lines electrically connected with the first portion of the touch electrode line and a plurality of second lines electrically connected with the second portion of the touch electrode line, and wherein
    each of the plurality of first lines is electrically connected with a respective one of the plurality of second lines in an area except for the active area, wherein at least one of the plurality of first lines is electrically connected with a second line electrically connected with a second portion included in a touch electrode line except for a touch electrode line including a first portion electrically connected with the first line.

2. The touch display device of claim 1, wherein the first line and the second line are electrically connected with each other in a pad area positioned in the non-active area.

3. The touch display device of claim 1, wherein the first line and the second line are electrically connected with each other on a printed circuit connected with the non-active area.

4. The touch display device of claim 1, wherein a first line electrically connected with a first portion of an ith touch electrode line is electrically connected with a second line electrically connected with a second portion of a jth touch electrode line, and wherein j is different from i.

5. The touch display device of claim 4, wherein a first line electrically connected with a first portion of the jth touch electrode line is electrically connected with a second line electrically connected with a second portion of the ith touch electrode line.

6. The touch display device of claim 1, wherein a sum of a length of the first line and a length of the second line falls within a predetermined range from a preset value.

7. The touch display device of claim 1, wherein a sum of a length of the first line and a length of the second line is constant.

8. The touch display device of claim 1, wherein the encapsulation part includes a planarized area positioned outside the active area and a non-planarized area positioned outside the planarized area, and wherein
    at least one first line disposed in the planarized area of the encapsulation part among the plurality of first lines is electrically connected with a second line disposed in the non-planarized area of the encapsulation part.

9. The touch display device of claim 1, wherein a touch electrode line separated into the first portion and the second portion is disposed in parallel with a longer edge of an outer border of the active area.

10. The touch display device of claim 1, wherein an area between the first portion and the second portion overlaps a folding area of the active area.

11. The touch display device of claim 1, wherein a border between the first portion and the second portion is aligned along one direction.

12. The touch display device of claim 1, wherein a border between the first portion and the second portion is positioned on at least two or more straight lines.

13. The touch display device of claim 1, wherein a touch driving signal is supplied to a touch electrode line separated into the first portion and the second portion, and wherein
    a touch sensing signal is received from a touch electrode line disposed in a direction crossing the separated touch electrode line.

14. The touch display device of claim 1, wherein a touch sensing signal is received form a touch electrode line separated into the first portion and the second portion, and wherein
    a period during which a touch driving signal is supplied to an area where the first portion of the touch electrode line to which the touch sensing signal is received is disposed differs from a period during which a touch driving signal is supplied to an area where the second portion is disposed.

15. A touch display device, comprising:
    a plurality of X-touch electrode lines arranged in a first direction;
    a plurality of Y-touch electrode lines arranged in a second direction crossing the first direction; and
    a plurality of touch routing lines electrically connected with the X-touch electrode line and the Y-touch electrode lines, wherein
    at least one touch electrode line among the X-touch electrode lines and the Y-touch electrode lines includes a first portion and a second portion separated from the first portion and disposed on a line where the first portion is disposed, wherein
    the plurality of touch routing lines include
    a plurality of first lines electrically connected with the first portion of the touch electrode line and a plurality of second lines electrically connected with the second portion of the touch electrode line, and wherein
    at least one of the plurality of first lines is electrically connected with a second line electrically connected with a second portion included in a touch electrode line except for a touch electrode line including a first portion electrically connected with the first line.

16. The touch display device of claim 15, wherein the first line and the second line are electrically connected with each other in an area except for an area where the touch electrodes are arranged.

17. The touch display device of claim 15, wherein a first line electrically connected with a first portion of an ith touch electrode line is electrically connected with a second line electrically connected with a second portion of a jth touch electrode line, and wherein j is different from i, and wherein a first line electrically connected with a first portion of the jth touch electrode line is electrically connected with a second line electrically connected with a second portion of the ith touch electrode line.

18. The touch display device of claim 17, wherein a border between a first portion and second portion of the ith touch electrode line is positioned on the same straight line as a border between a first portion and second portion of the jth touch electrode line.

19. The touch display device of claim 18, wherein a border between a first portion and second portion of at least one touch electrode line among touch electrode lines except for the ith touch electrode line and the jth touch electrode line is positioned on a straight line different from a border between a first portion and second portion of the ith touch electrode line.

20. A touch display device, comprising:
- a plurality of touch electrode lines arranged in a first active area; and
- a plurality of touch electrode lines arranged in a second active area positioned on a side of the first active area and separated from the touch electrode lines arranged in the first active area, wherein
- an ith touch electrode line disposed in the first active area and a jth touch electrode line disposed in the second active area are simultaneously driven, and a jth touch electrode line disposed in the first active area and an ith touch electrode line disposed in the second active area are simultaneously driven, and wherein i differs from j.

* * * * *